United States Patent
Maeda et al.

(10) Patent No.: US 7,783,273 B2
(45) Date of Patent: Aug. 24, 2010

(54) METHOD AND SYSTEM FOR CALIBRATING FREQUENCIES-AMPLITUDE AND PHASE MISMATCH IN A RECEIVER

(75) Inventors: Koji Maeda, Kokubunji (JP); Satoshi Tanaka, Kokubunji (JP); Yukinori Akamine, Kokubunji (JP); Manabu Kawabe, Hachioji (JP)

(73) Assignee: Renasas Electronics Corporation, Kanagawa (JP)

( * ) Notice: Subject to any disclaimer, the term of this patent is extended or adjusted under 35 U.S.C. 154(b) by 932 days.

(21) Appl. No.: 11/543,928

(22) Filed: Oct. 6, 2006

(65) Prior Publication Data

US 2007/0080835 A1 Apr. 12, 2007

(30) Foreign Application Priority Data

Oct. 7, 2005 (JP) .............................. 2005-294444

(51) Int. Cl.
*H04B 1/10* (2006.01)
*H04B 7/00* (2006.01)
(52) U.S. Cl. ..................... 455/285; 455/278.1; 455/302
(58) Field of Classification Search ................ 455/130, 455/63.1, 285, 302, 278.1, 296
See application file for complete search history.

(56) References Cited

U.S. PATENT DOCUMENTS

| | | | | |
|---|---|---|---|---|
| 6,009,317 A | * | 12/1999 | Wynn | .......................... 455/296 |
| 6,434,204 B1 | * | 8/2002 | Amir et al. | ................... 375/346 |
| 6,891,423 B2 | * | 5/2005 | Bjork et al. | .................. 327/355 |
| 7,254,379 B2 | * | 8/2007 | Xu et al. | ...................... 455/296 |
| 7,477,687 B2 | * | 1/2009 | Ozluturk et al. | ............. 375/235 |
| 7,477,881 B2 | * | 1/2009 | Kim | .......................... 455/130 |
| 7,580,680 B2 | * | 8/2009 | Isaac et al. | ............... 455/67.11 |
| 2005/0070236 A1 | | 3/2005 | Paulus | |
| 2005/0148304 A1 | * | 7/2005 | Jerng | .......................... 455/75 |
| 2006/0068739 A1 | | 3/2006 | Maeda et al. | |
| 2007/0097271 A1 | * | 5/2007 | Gao et al. | ................... 348/724 |

FOREIGN PATENT DOCUMENTS

| | | |
|---|---|---|
| JP | 8-307465 | 4/1995 |
| JP | 2006-101388 | 9/2004 |

OTHER PUBLICATIONS

Office Action from Japanese Patent Office regarding JP Application 2005-294444 dated Nov. 24, 2009.

* cited by examiner

*Primary Examiner*—Sonny Trinh
(74) *Attorney, Agent, or Firm*—Stites & Harbison, PLLC; Juan Carlos A. Marquez, Esq.

(57) ABSTRACT

The receiver, which enables rejection of image signals with higher accuracy over wider frequency band, can be provided as a low IF receiver by inputting a calibration signal of frequency $f_i$ ($1 \leq i \leq N$) before reception of signals and determining the frequency response $f_a(z)$ to $f_d(z)$ of a calibrating filter in a filter mismatch calibrating circuit (FIL_CAL) 195 to make zero amplitude and phase mismatches between the I component and Q component of the quadrature demodulation signal at the frequency $f_{IFi}$.

20 Claims, 30 Drawing Sheets

FREQUENCY CONVERSION
FROM RF BAND TO IF BAND

FREQUENCY CONVERSION FROM IF BAND TO
BASEBAND BY IMAGE REJECTION CIRCUIT

RELATION BETWEEN IRR
AND AMPLITUDE MISMATCH

RELATION BETWEEN IRR
AND PHASE MISMATCH

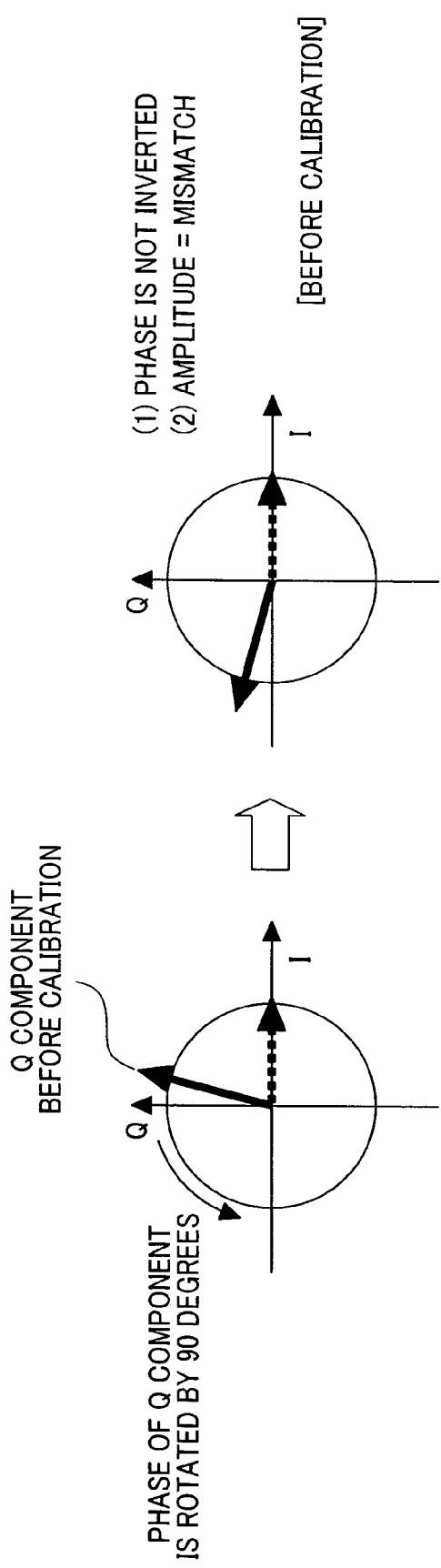

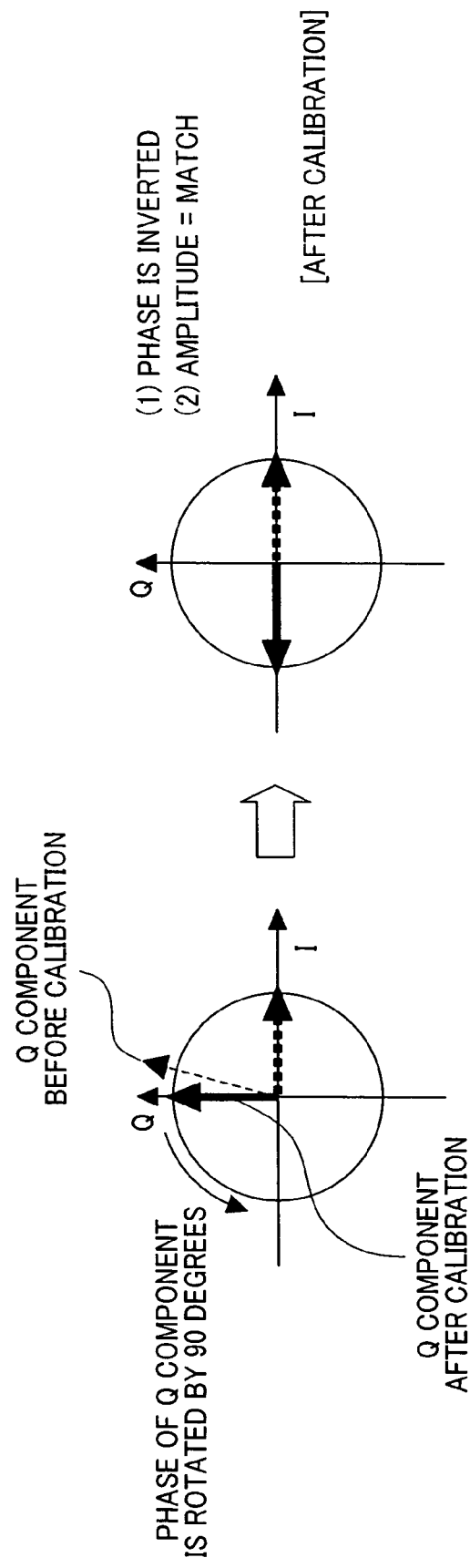

METHOD AND SYSTEM FOR CALIBRATING FREQUENCIES-AMPLITUDE AND PHASE MISMATCH IN A RECEIVER

CLAIM OF PRIORITY

The present application claims priority from Japanese application JP 2005-294444 filed on Oct. 7, 2005, the content of which is hereby incorporated by reference into this application.

FIELD OF THE INVENTION

The present invention relates to a receiver and a mobile radio terminal used in a radio system, and particularly to a technology for calibrating, with a plurality of frequencies, amplitude mismatch and phase mismatch between an in-phase (I) component and a quadrature (Q) component in a quadrature demodulation signal.

BACKGROUND OF THE INVENTION

In US Patent Application Publication of US 2005/0070236 A1, the technology is described for calibrating mismatch using a result on detecting phase and amplitude mismatch of a quadrature demodulation signal in order to realize high precision image rejection in a low IF receiver. Particularly, FIG. 6B of US 2005/0070236 A1 illustrates an example of an IQ mismatch correcting circuit.

SUMMARY OF THE INVENTION

A radio system explained below has been employed into a mobile phone system or the like. In this radio system, the transmitting data is divided into an in-phase (I) component and a quadrature (Q) component and a quadrature modulating signal in the radio frequency (hereinafter abbreviated as "RF") band is generated by modulating these components with the carriers including phase difference of 90 degrees therein.

In this radio system, a low IF receiving system has been widely employed in recent years, in place of the existing super-heterodyne system, in which the RF received signal is frequency-converted into a lower intermediate frequency (hereinafter abbreviated as "IF") band, for example, of 100 kHz to 200 kHz near the DC component and thereafter the baseband signal is obtained from such IF band. This system is capable of more reducing external components and manufacturing radio equipment at a lower cost than that in the existing super-heterodyne system.

In the low IF system, it is known that a problem is generated when the RF received signal in the frequency of $f_{LO}+f_{IF}$ is converted to the IF signal in the frequency of $f_{IF}$ using a local oscillator (hereinafter referred to as "LO") to generate a local signal in the frequency of $f_{LO}$. The known problem is that an interfering wave (hereinafter referred to as image signal) in the frequency of $f_{LO}-f_{IF}$, which is symmetrical to the received signal for the LO frequency, is also frequency-converted to the frequency $f_{IF}$ and thereby this image signal is superimposed on the received signal. In this case, an ordinary filter cannot attenuate only the image signal without occurrence of deterioration in the received signal.

When an image rejection circuit is used for frequency conversion of the received signal to the baseband signal from the IF band signal, the image signal superimposed on the received signal can be separated by setting the frequency of image signal to $2f_{IF}$.

However, accuracy of image rejection is lowered when amplitude and phase mismatches exist between the I and Q components of the input signal to the image rejecting circuit.

Here, image rejection accuracy can also be evaluated in terms of an image rejection ratio (IRR). IRR is expressed with a power ratio of the received signal and the image signal included in an output of the image rejecting circuit when the received signal and the image signal are inputted to the image rejecting circuit in the equal power as expressed in the Equation (1).

$$IRR = \frac{\text{(Output power of received signal in image rejecting circuit)}}{\text{(Output power of image signal in image rejecting circuit)}} \quad (1)$$

$$= \frac{1 + 2(1 + A_m)\cos\theta_m + (1 + A_m)^2}{1 - 2(1 + A_m)\cos\theta_m + (1 + A_m)^2}$$

In the above Equation, it is assumed that an input power to the image rejecting circuit is identical in both received signal and image signal and $A_m$ is designated as amplitude mismatch and $\theta_m$, as phase mismatch.

In the present semiconductor process, it is very difficult to manufacture low price integrated circuits (IC) by suppressing mismatch, for example, to the accuracy for obtaining IRR of 50 dB or higher. Therefore, a circuit for calibrating mismatch between the I and Q components in the quadrature demodulation signal is essential in order to apply the low IF receiving system in the radio system where the image signal is higher.

The US 2005/0070236 A1 explained above discloses a method for calculating a correction coefficient for mismatch by inputting a tone signal for calibration to a receiver, detecting IQ mismatch in the quadrature demodulation signal with a digital circuit, and using a feedback circuit. FIG. 6B of US 2005/0070236 A1 illustrates an example of the IQ mismatch correcting circuit. The calibrating circuit of FIG. 6B calibrates mismatches in IQ amplitude and phase using four variable gain amplifiers.

The method disclosed in US 2005/0070236 A1 can be simplified as FIG. 24. The existing IQ mismatch calibrating circuit illustrated in the FIG. 24 is constituted with inclusion of input terminals 196, 197, output terminals 198, 199, an amplitude/phase mismatch calibrating circuit (GP_CAL) 25, and a correction coefficient calculating circuit (C_CALC) 21.

In the FIG. 24, a calibration signal inputted to the receiver is isolated to the I and Q components with a quadrature demodulating mixer of the receiver not illustrated and these IQ components are converted to digital signals with an ADC through an amplifier circuit and a filter circuit. In this case, mismatches have been added to the digital calibration signals inputted to the input terminals 196, 197 in the I and Q paths of receiver explained above. Thereafter, the digital calibration signals are inputted to the amplitude/phase mismatch calibrating circuit (GP_CAL) 25. This amplitude/phase mismatch calibrating circuit (GP_CAL) 25 corrects IQ mismatches by applying linear transformation to the IQ components. The amplitude/phase mismatch calibrating circuit (GP_CAL) 25 is constituted with inclusion of variable gain amplifiers 200 to 203 and digital adders 204, 205. The signals of I and Q components inputted to the amplitude/phase mismatch calibrating circuit (GP_CAL) 25 are defined respectively as $I_{in}$ and $Q_{in}$, the output signals of I and Q components as $I_{out}$, $Q_{out}$, and gains of variable gain amplifiers 201, 203, 202, 200 as correction coefficients a, b, c, and d. An output signal of the amplitude/phase mismatch calibrating circuit (GP_CAL) 25 is expressed with the Equation (2).

$$\begin{bmatrix} I_{out} \\ Q_{out} \end{bmatrix} = \begin{bmatrix} dc \\ ab \end{bmatrix} \begin{bmatrix} I_{in} \\ Q_{in} \end{bmatrix} = \begin{bmatrix} dI_{in} + cQ_{in} \\ a)_{in} + bQ_{in} \end{bmatrix} \quad (2)$$

The Equation (2) suggests that mismatch can be calibrated by adequately selecting the correction coefficients a, b, c, and d even when mismatches of amplitude and phase are added between the input signals $I_{in}$ and $Q_{in}$.

A digital calibration signal outputted from the amplitude/phase mismatch calibrating circuit (GP_CAL) 25 is inputted to the correction coefficient calculating circuit (C_CALC) 21 for detection of IQ mismatch and calculation of correction coefficient. The correction coefficient calculated is then fed back to the amplitude/phase mismatch calibrating circuit (GP_CAL) 25 to update the correction coefficients a, b, c, and d. Correct correction coefficients can be detected by repeating detection of mismatch and updating of correction coefficients. The signal completed calibration of IQ mismatch is then inputted to the image rejecting circuit for execution of highly accurate image rejection.

With use of the method explained above, mismatch not depending on the frequency generated with circuits such as mixer, PGA, and ADC can be calibrated.

However, as represented, for example, by IQ mismatch of a filter, if IQ mismatch depending on frequency is generated within a receiver, the existing calibration method disclosed in US 2005/0070236 A1 probably cannot acquire the frequency band for image rejection with a higher IRR.

FIG. 25 illustrates relationship between IRR and frequency when IQ mismatch has been calibrated using the existing amplitude/phase mismatch calibrating circuit. Here, as a mismatch of a filter, the mismatch of 2% in I and Q components is assumed to exist at the cut-off frequency of a third-order Bessel filter and calibration is executed using the calibration signal where the frequency is −200 kHz. In FIG. 25, the frequency is given a minus sign in order to indicate that the frequency is calibrated in the image signal band. According to FIG. 25, higher IRR can be obtained mainly at the frequencies only around the calibration frequency after the calibration (broken line) in comparison with the values before the calibration (solid line). Therefor, the frequency band indicating higher image rejection ratio is rather narrow and sufficient IRR cannot be acquired with the GSM band (hatched region) corresponding to the IF of 200 kHz, not satisfying the GSM standard.

Namely, higher IRR can be expected at the frequency near the calibration signal frequency in the IF band but when the IQ mismatch depending on frequency exists, an IRR value is deteriorated as frequency is separated from the calibration signal frequency.

In the case of low IF receiving system, a frequency interval between the received signal and a high-power interfering signal becomes small in the IF band. Therefore, the cut-off frequency of an analog LPF of the receiver is sometimes set to the frequency near the edge of the received signal frequency band in order to realize that a dynamic range of ADC is not saturated with the interfering signal. In the analog filter, the problem explained above appears remarkably, because a large IQ mismatch is generated at the frequency near the cut-off frequency.

It is therefore an object of the present invention to provide a receiver and a mobile radio terminal for rejecting image signal with higher accuracy over a wider frequency band in a low IF receiver.

A typical example of the present invention will be explained below. Namely, the receiver of the present invention comprises a quadrature mixer for generating a couple of almost quadrature demodulation outputs of I and Q components from the received RF signal and the local signal for receiver and a phase/amplitude calibrating unit for calibrating both amplitude mismatch and phase mismatch between a couple of demodulating outputs, and the phase/amplitude calibrating unit has a function to respectively set image rejection ratios at the setting points of a plurality of frequencies within the receiving band so that an image rejection ratio (IRR) of the image interfering signal for the desired received signal in the desired frequency band at the quadrature-mixer output satisfies the standard required for the receiver.

According to the present invention, highly accurate image rejection over a wider frequency band can be realized because IQ mismatch is calibrated in a plurality of frequencies.

BRIEF DESCRIPTION OF THE DRAWINGS

FIG. 7C is a diagram showing the operation principle of the image rejecting circuit.

FIG. 7D is a diagram showing the operation principle of the image rejecting circuit.

DETAILED DESCRIPTION OF THE PREFERRED EMBODIMENTS

The preferred embodiments of a receiver, a receiving method or a mobile radio terminal of the present invention will be explained in detail on the basis of several embodiments with reference to the accompanying drawings.

First Embodiment

A first embodiment of the present invention will be explained with reference to FIG. 1 to FIG. 8.

Figure 1:
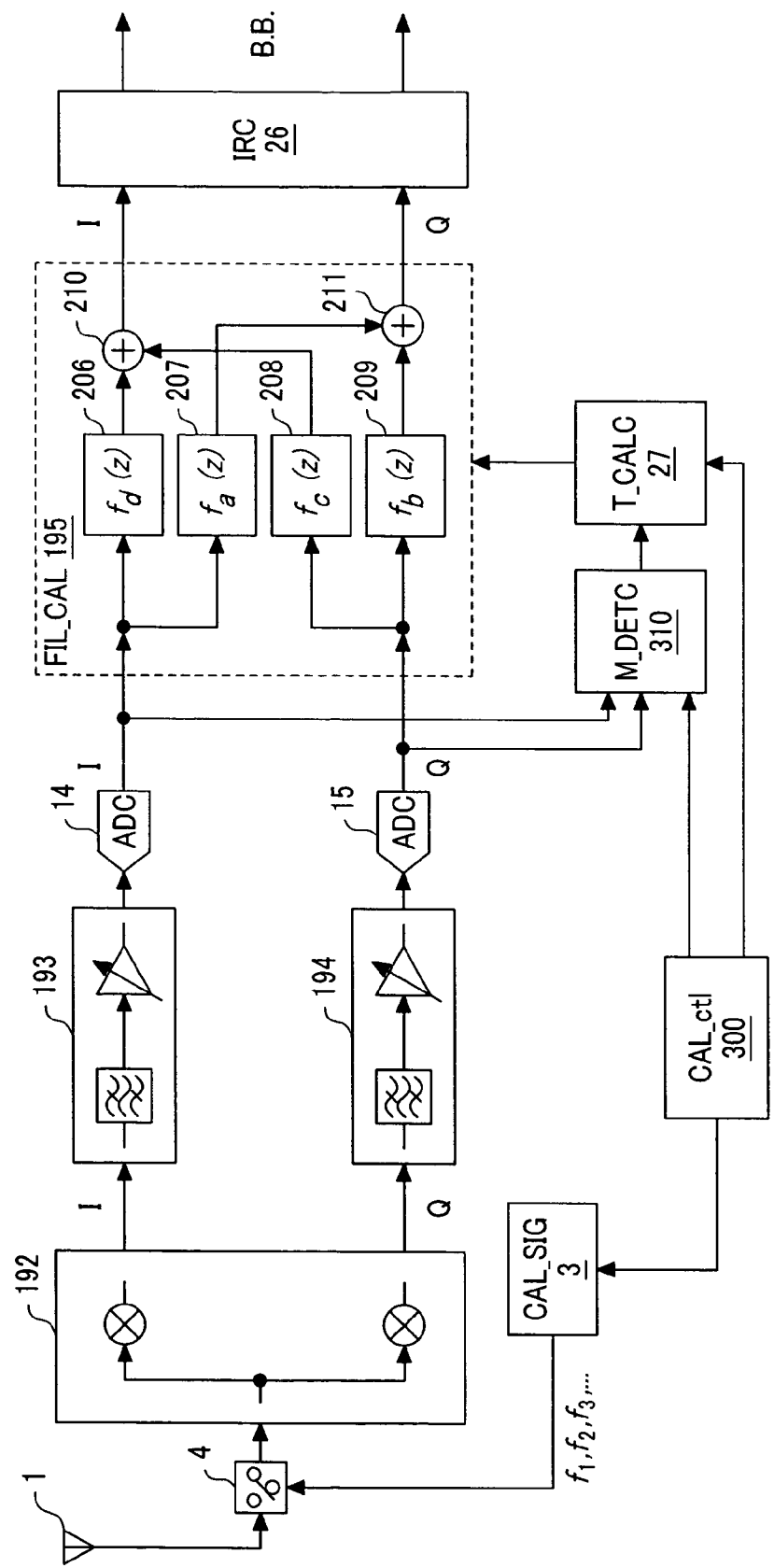
FIG. 1 is a structural diagram of a low IF receiver of a first embodiment of the present invention.

First, FIG. 1 illustrates an example of structure of a receiver as the first embodiment of the present invention. A low IF receiver illustrated in FIG. 1 comprises an antenna 1, a calibration signal source 3, a switch 4, a quadrature mixer 192, an I component signal path 193, a Q component signal path 194, analog/digital converters (hereinafter referred to as "ADCs" (analog to digital converters) 14, 15, a filter mismatch calibrating circuit (FIL_CAL) 195, an image rejecting circuit (IRC) 26, a tap coefficient calculating circuit (T_CALC) 27, a calibration control circuit (CAL_ctl) 300, and a filter mismatch detecting circuit (M_DETC) 310.

This embodiment is characterized in comprising a filter mismatch calibrating unit including the calibration signal source 3, switch 4, tap coefficient calculating circuit (T_CALC) 27, filter mismatch calibrating circuit (FIL_CAL) 195, calibration control circuit (CAL_ctl) 300, and filter mismatch detecting circuit (M_DETC) 310. This filter mismatch calibrating unit has the function, as is explained below in detail, for setting a plurality of image rejection ratios at a plurality of setting points of the frequencies so that the image rejection ratio (IRR) of the image interfering signal for the desired received signal in the desired frequency band at the input of the image rejecting circuit (IRC) 26 satisfies the standard required for the receiver. Therefore, the present invention is configured to satisfy the above standard for the entire range of the desired frequency band explained above.

In the receiver of this embodiment, an operation mode is switched to any mode of the "filter mismatch calibrating mode" operated before reception of signal to calibrate a mismatch which is generated between the I component signal path 193 and the Q component signal path 194 and depends on the frequency and the "receiving mode" where the RF signal is received and is converted to the baseband signal.

In the "filter mismatch calibrating mode", a calibration signal in the frequency of $f_i$ is inputted to the switch 4 from the calibration signal source 3 under the control of the calibration control circuit (CAL_ctl) 300. The calibration control circuit (CAL_ctl) 300 has a function to control a series of calibrating operation in the "filter mismatch calibrating mode" of the receiver. Here, i is a natural number in the range of 1=i=N and N indicates the number of frequencies for calibration. A larger N results in increase in total amount of calculations and increase of circuit scale. When the receiver corresponds, for example, to the GSM standard, mismatch depending on frequency can be calibrated in wider frequency range by calibrating IQ mismatch using the calibration signal of a plurality of frequencies $f_i$ corresponding to the frequency band of this standard.

Figure 2:
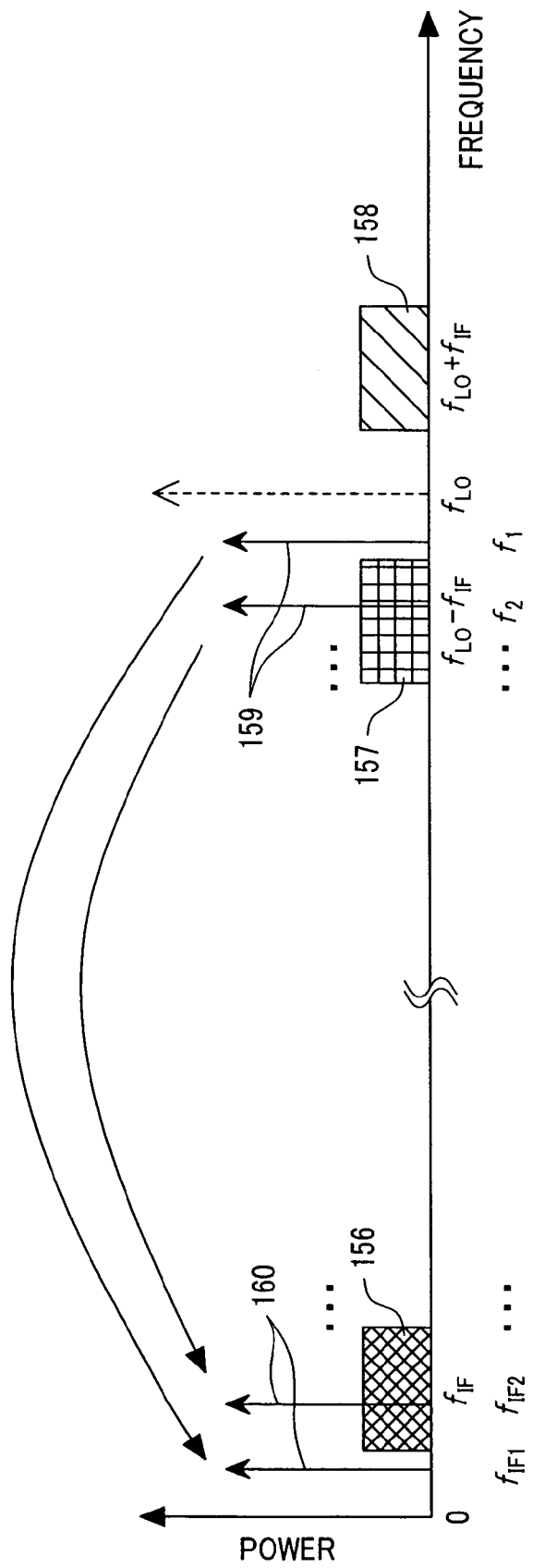
FIG. 2 is a diagram showing a calibration signal frequency in the first embodiment.

Frequency $f_i$ of calibration signal will be explained with reference to FIG. 2. In FIG. 2, the vertical axis indicates frequency and the vertical axis, signal power. The frequency band symmetrical to the received signal (or receiving signal) band 158 for the local frequency $f_{LO}$ is assumed as an image signal band 157. The frequency fi of the calibration signal 159 in the RF band is set to the frequency within the image signal band 157 or to the frequency near such frequency. The calibration signal 159 in the RF band is frequency-converted to the IF band 156 with the quadrature mixer. The frequency of the calibration signal 160 of the IF band is assumed as $f_{IFi}$. This frequency $f_{IFi}$ is expressed with $f_{IFi}=\omega_{IFi}/(2\omega)$ (here, $\omega_{Ifi}<0$). The received signal is assumed to have the frequency which is higher by $f_{IF}$ than the frequency of local signal and the image signal is assumed to have the frequency which is lower by $f_{IF}$ than the frequency of local signal. In the actual low IF receiver, the received signal may have the frequency which is lower by fIF than the local signal. In this case, it is enough when the relation of the received signal and image signal is considered oppositely.

Returning to FIG. 1, the calibration signal of frequency fi is inputted to the quadrature mixer 192 via the switch 4. Here, the calibration signal is frequency-converted to the frequency $f_{IFi}$ in the IF band and this signal is separated to the signals of I component and Q component having a phase difference of 90 degrees to the I component.

The calibration signals of I and Q components outputted from the quadrature mixer are respectively converted into the digital signals after these are inputted to the ADCs 14, 15 via the I component signal path 193 and the Q component signal path 194. The I component signal path 193 and the Q component signal path 194 respectively have a filter for rejecting at least interfering signal and an amplifier for amplifying received signal power. To the calibration signals, amplitude and phase mismatches are added between the I and Q components due to fluctuation of characteristic of the circuits generated in the quadrature mixer 192, I component signal path 193, Q component signal path 194, and ADCs 14, 15. Particularly, the amplitude and phase mismatches depending on frequency are added due to fluctuation of the filter circuit in the I component signal path 193 and Q component signal path 194.

The amplitude and phase mismatches between the I and Q components of the receiver are detected with a filter mismatch detecting circuit (M_DETC) 310 on the basis of the digital calibration signals outputted from the ACDs 14, 15. Mismatches in a plurality of (N) frequencies $f_{IFi}$ in the IF band are all detected by repeating the operations explained above for N times.

In addition, a tap coefficient is updated by calculating the tap coefficient (frequency characteristics $f_a(z)$ to $f_d(z)$) of the filter mismatch calibrating circuit (FIL_CAL) 195 with a tap coefficient calculating circuit (T_CALC) 27 on the basis of the detected mismatch. With the operations explained above, image rejection ratio (IRR) is respectively set at the setting points of a plurality of frequencies.

In the receiving mode, the RF receiving signal is received with the antenna 11 and is then inputted to the quadrature mixer 192 via the switch 4. The RF received signal is frequency-converted to the IF signal in the quadrature mixer 192 and is separated into the I component signal and the Q component signal having a phase difference of 90 degrees to the I component signal. In this case, when the image signal is received together with the received signal, the image signal is also frequency-converted into the IF band signal.

The I component and Q component received signals and the image signal outputted from the quadrature mixer are respectively inputted to the ADCs 14, 15 and are also converted to the digital signals via the I component signal path 193 and the Q component signal path 194. The I component signal path 193 and the Q component signal path 194 are respectively provided at least with a filter for rejecting interfering signal and an amplifier for amplifying received signal power. The amplitude and phase mismatches are added between the I and Q components of the received signal and image signal due to fluctuation in characteristic of the circuit generated in the I component signal path 193, Q component signal path 194, and ADCs 14, 15. Particularly, the amplitude and phase mismatches depending on frequency are added due to fluctuation of the filter circuit in the I component signal path 193 and the Q component signal path 194.

The digital received signal and image signal outputted from the ADCs 14, 15 are inputted to the filter mismatch calibrating circuit (FIL_CAL) 195. The filter mismatch calibrating circuit (FIL_CAL) 195 corrects IQ mismatch depending on frequency of the image signal by executing the linear transformation to both I and Q components in every $f_{IFi}$. The calibration filters 207, 209, 208, 206 respectively have the characteristics of $f_a(z)$, $f_b(z)$, $f_c(z)$, and $f_d(z)$. When the signals of I component and Q component inputted to the filter mismatch calibrating circuit (FIL_CAL) 195 are designated as $I_{inz}$ and $Q_{inz}$ and the signals of I component and Q component outputted therefrom as $I_{outz}$ and $Q_{outz}$, these $I_{outz}$ and $Q_{outz}$ are respectively expressed by the Equation (3.1).

$$\begin{bmatrix} I_{outz} \\ Q_{outz} \end{bmatrix} = \begin{bmatrix} f_d(z) f_c(z) \\ f_a(z) f_b(z) \end{bmatrix} \begin{bmatrix} I_{inz} \\ Q_{inz} \end{bmatrix} = \begin{bmatrix} f_d(z) I_{inz} + f_c(z) Q_{inz} \\ f_a(z) I_{inz} + f_b(z) Q_{inz} \end{bmatrix} \quad (3.1)$$

The Equation (3.1) suggests that if the amplitude and phase mismatches depending on frequency is added between the input signals $I_{inz}$ and $Q_{inz}$, the mismatch depending on frequency can be calibrated by adequately selecting the frequency characteristics $f_a(z)$, $f_b(z)$, $f_c(z)$, and $f_d(z)$ of the calibration filters.

In the receiving mode, frequency characteristics of the calibration filters are already set to make zero mismatch at the setting points $f_{IFi}$ of a plurality of frequencies in the image signal frequency band in the "filter mismatch calibrating mode". Therefore, the mismatch of image signal outputted from the filter mismatch calibrating circuit (FIL_CAL) 195 becomes zero in every setting point $f_{IFi}$ of frequency. The received signal and image signal outputted from the filter mismatch calibration circuit (FIL_CAL) 195 are inputted to the image rejecting circuit (IRC) 26. With the image rejecting circuit (IRC) 26, the received signal is frequency-converted into the baseband frequency and thereby the image signal can be attenuated.

Figure 3:
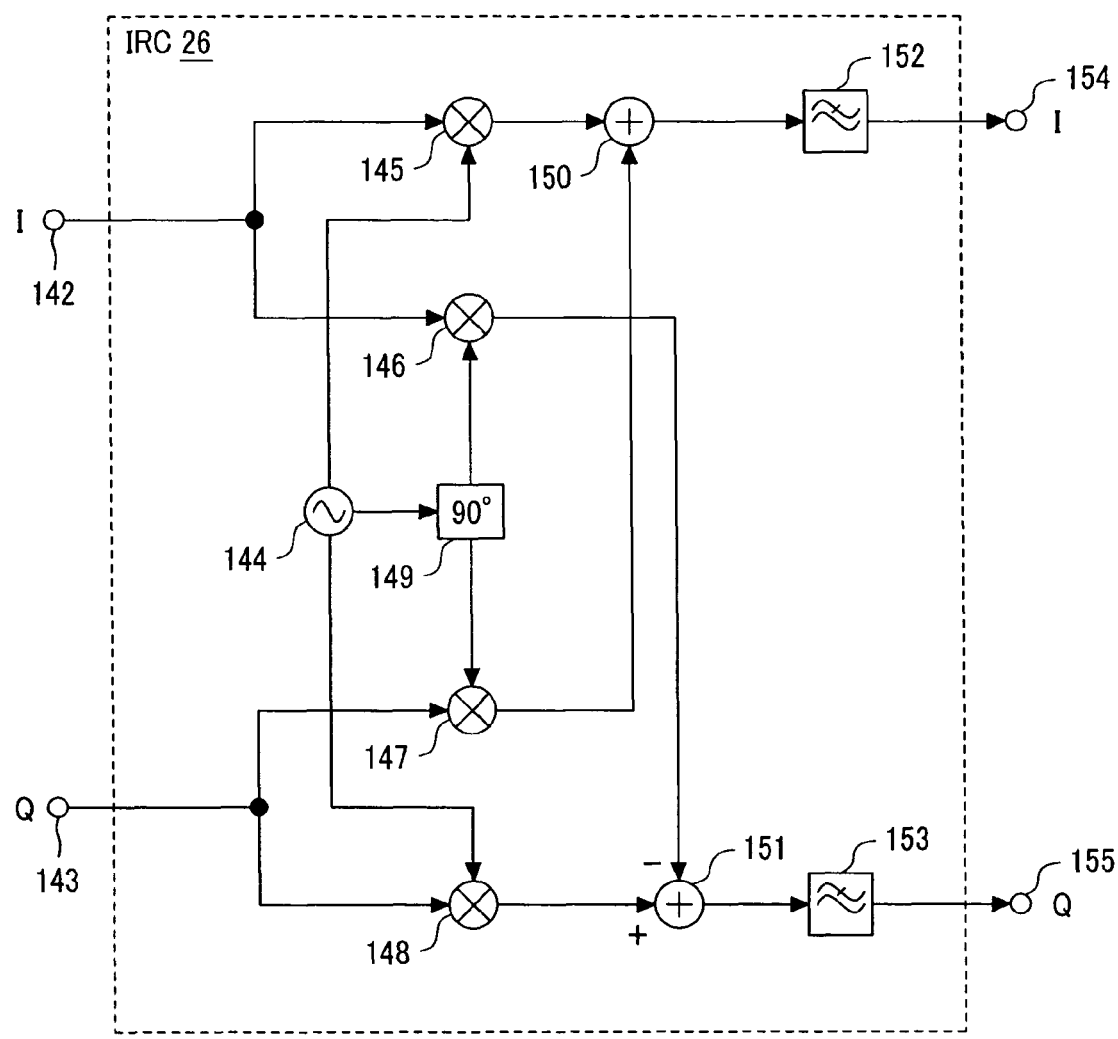
FIG. 3 is a structural diagram of an image rejecting circuit in the first embodiment.
Figure 4A:
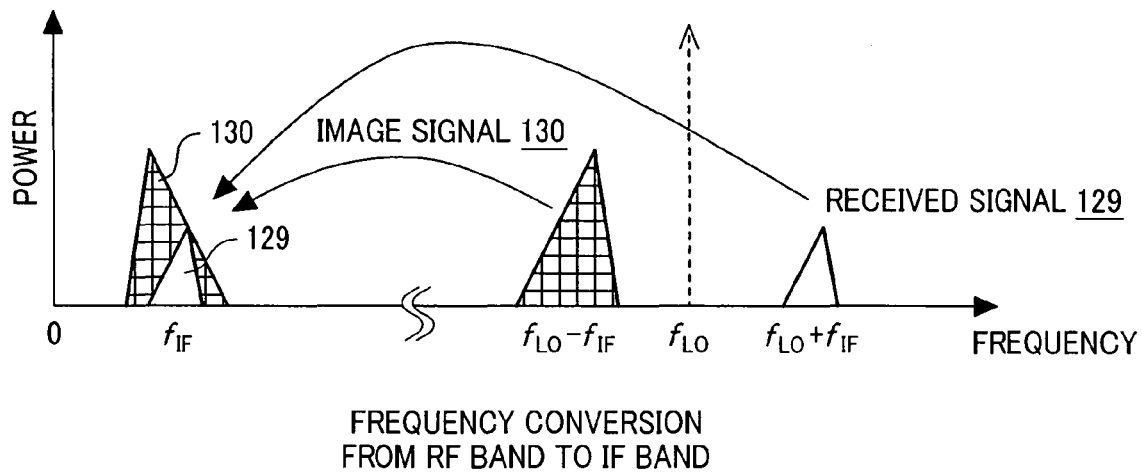
FIG. 4A is a diagram showing a relationship between a received signal and an image signal.
Figure 4B:
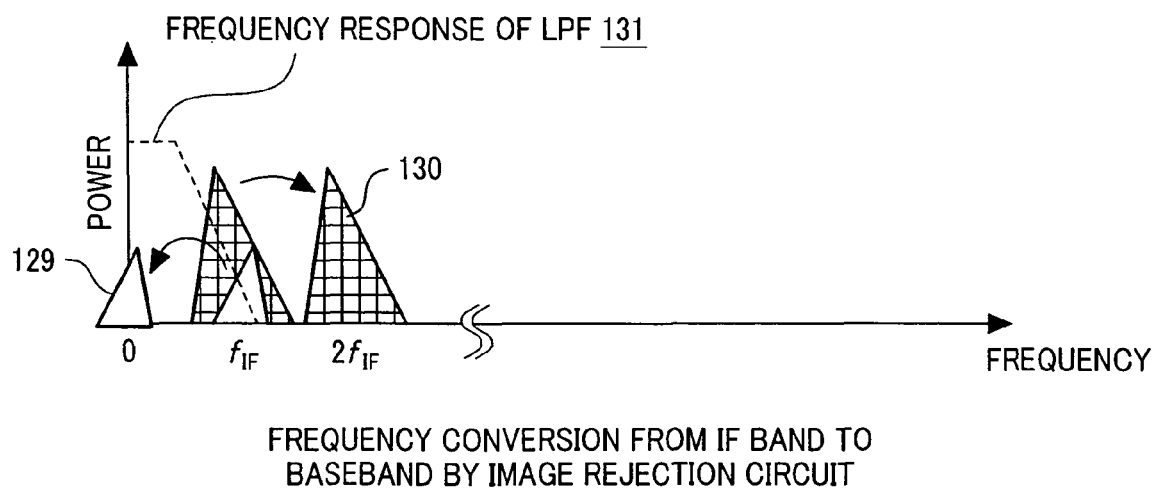
FIG. 4B is a diagram showing a relationship between the received signal and the image signal.

Next, an example of structure of the image rejecting circuit (IRC) 26 and the basic operations thereof will be described with reference to FIG. 3 and FIG. 4 (FIGS. 4A, 4B).

In FIG. 3, the image rejecting circuit (IRC) 26 is constituted with digital multipliers 145 to 148, a digital 90° phase shifter 149, a digital adder 150, a digital subtracter 151, LPFs 152, 153, a digital oscillator 144, input terminals 142, 143, and output terminals 154, 155.

Here, it is assumed that the ideal quadrature demodulation signals $I_{IF}$ and $Q_{IF}$ freed from the phase and amplitude mismatches expressed with the Equations (4.1) and (4.2) are respectively inputted to the input terminals 142, 143 of the image rejecting circuit (IRC) 26.

$$I_{IF}(t) = A(t) \cdot \cos(\omega_{IF} t + a) + B(t) \cdot \cos(-\omega_{IF} t + \beta) \quad (4.1)$$

$$Q_{IF}(t) = A(t) \cdot \sin(\omega_{IF} t + a) + B(t) \cdot \sin(-\omega_{IF} t + \beta) \quad (4.2)$$

Here, A(t) and B(t) are respectively assumed as modulation signal components of received signal and image signal, while $a$ and $\beta$, as phases of the carrier components of the received signal and image signal, $\omega_{IF}$, as IF angular frequency, and t, as time.

The Equations (4.1) and (4.2) suggest that the received signal and image signal are in the identical frequency band as illustrated in FIG. 4A.

Meanwhile, the digital oscillator 144 generates a tone signal $\cos(\omega_{IF} t)$ in the IF band and then outputs this IF signal to the digital multipliers 145, 148. The digital 90° phase shifter 149 generates $\sin(\omega_{IF} t)$ having a phase difference of 90 degrees and outputs this signal to the multipliers 146, 147 by receiving an output of the digital oscillator 144. Outputs of the multipliers 145 and 147 are added with each other in the digital adder 150, while outputs of the multipliers 146 and 148 are subjected to subtraction with each other in the digital subtracter 151.

Accordingly, outputs of the digital adder 150 and digital subtractor 151 are expressed with $I_B$, $Q_B$ of the following Equations (4.3) and (4.4).

$$I_B = I_{IF} \times \cos(\omega_{IF} t) + Q_{IF} \times \sin(\omega_{IF} t) = A(t) \cdot \cos a + B(t) \cdot \cos(2\omega_{IF} t - \beta) \quad (4.3)$$

$$Q_B = -I_{IF} \times \sin(\omega_{IF} t) + Q_{IF} \times \cos(\omega_{IF} t) = A(t) \cdot \sin a - B(t) \cdot \sin(2\omega_{IF} t - \beta) \quad (4.4)$$

The Equations (4.3) and (4.4) suggest that the received signal has been frequency-converted to the baseband and the image signal, to the frequency 2 times the intermediate frequency, as illustrated in FIG. 4B. Moreover, only the received signal can be obtained through attenuation of the image signal as expressed by the Equations (4.5) and (4.6) by executing channel filtering with the LPFs 152, 153.

$$LPF[I_B] = LPF[A(t) \cdot \cos a + B(t) \cdot \cos(2\omega_{IF} t - \beta)] = A(t) \cdot \cos a \quad (4.5)$$

$$LPF[Q_B] = LPF[A(t) \cdot \sin a - B(t) \cdot \sin(2\omega_{IF} t - \beta)] = A(t) \cdot \sin a \quad (4.6)$$

The low IF system has also a problem that the image signal 130 of frequency $f_{LO} - f_{IF}$ symmetrical to the received signal 129 for the LO frequency is also frequency-converted to the frequency $f_{IF}$ and is superimposed on the received signal 129 as shown in FIG. 4A when the RF received signal 129 of frequency $f_{LO} + f_{IF}$ is frequency-converted to the intermediate frequency $f_{IF}$ using the LO to generate a local signal of frequency $f_{LO}$. In the case of an ordinary filter, it is impossible to attenuate only the image signal without deterioration of the received signal 129.

Therefore, when the image rejecting circuit is used for frequency conversion of the received signal 129 to the baseband from the IF band, the received signal 129 can be separated from the image signal 130 superimposed thereto by setting the frequency of image signal to $2f_{IF}$. Moreover, the image signal 130 can be attenuated and only the received signal 129 can be extracted by setting the frequency characteristic 131 of the low-pass filter (hereinafter abbreviated to as "LPF") to set the baseband frequency as the passing region and the frequency $2f_{IF}$ as the attenuating region.

In the case where the ideal quadrature demodulation signal freed from phase and amplitude mismatches is inputted to the image rejecting circuit (IRC) 26, the received signal and image signal can be separated perfectly. However, if amplitude and phase mismatches exist between the I and Q components, perfect separation between the received signal and image signal becomes impossible and thereby communication quality is deteriorated, for example, BER (Bit Error Rate) is lowered.

Figure 5A:
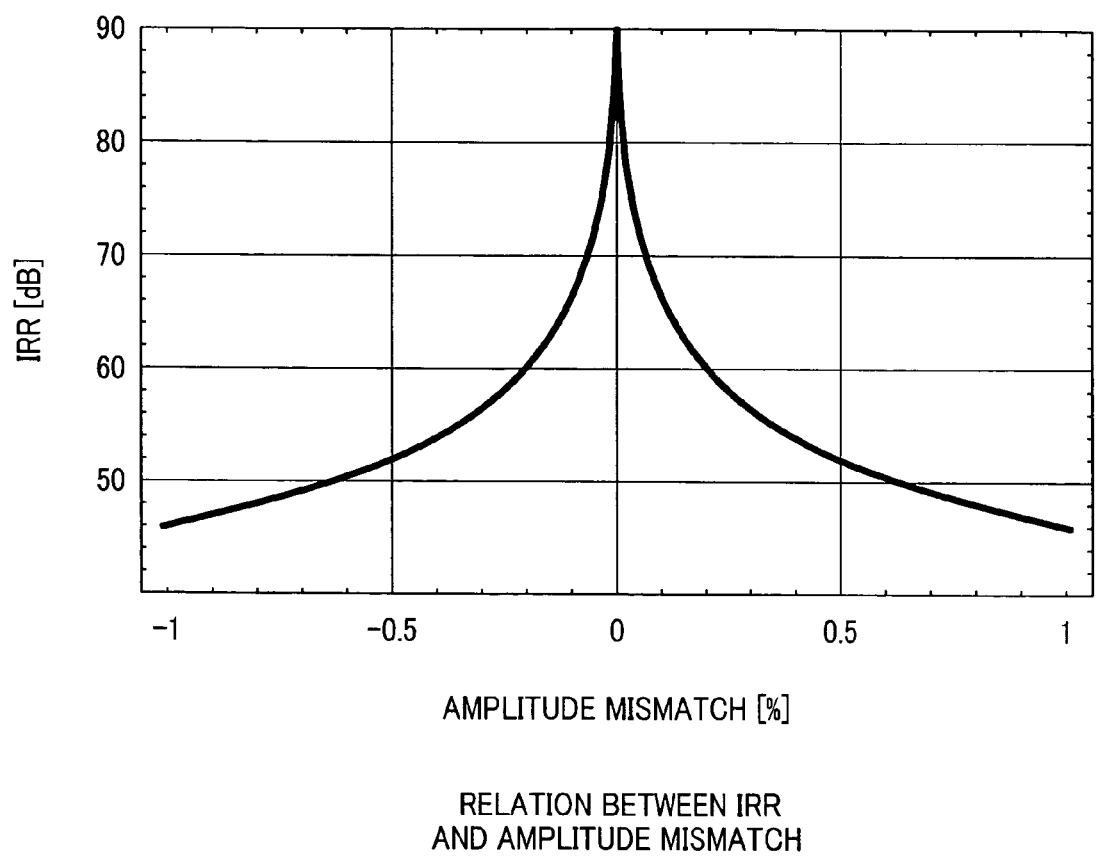
FIG. 5A is a diagram showing a relationship between an IRR value and an amplitude mismatch.
Figure 5B:
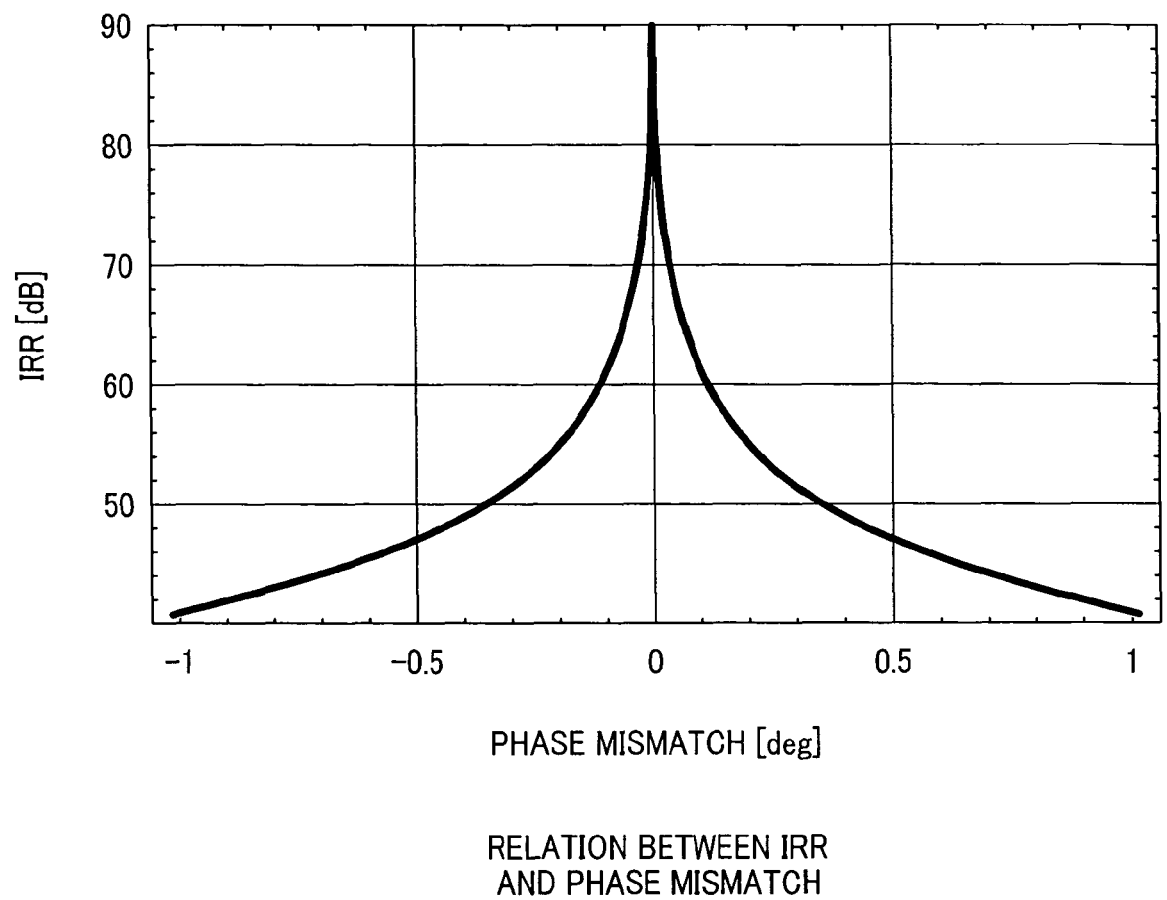
FIG. 5B is a diagram showing a relationship between an IRR value and a phase mismatch.

Here, relationships between IRR and amplitude mismatch and phase mismatch are illustrated in FIG. 5A and FIG. 5B, respectively. FIG. 5A illustrates relationship between IRR and amplitude mismatch when phase mismatch is not detected, while FIG. 5B illustrates relationship between IRR and phase mismatch when amplitude mismatch is not detected. FIG. 5A and FIG. 5B illustrate that IRR is lowered by amplitude and phase mismatches. For example, based on the assumption from the GSM (Global System for Mobile communication) standard in the mobile phone system, IRR of 50 dB or higher is required when IF is set to 200 kHz and the amplitude mismatch (when phase mismatch is not detected) must be about 0.6% or less, while the phase mismatch (when amplitude mismatch is not detected) must be about 0.4 degree or less.

In the low IF receiver as illustrated in FIG. 1, such mismatch of IQ components is generated by fluctuation in manufacture and temperature characteristic of analog circuits such as quadrature mixer 192, band-pass filter (hereinafter abbreviated as "BPF") of I component signal path 193 and Q component signal path 194, programmable gain amplifier (hereinafter abbreviated as "PGA") of I component signal path 193 and Q component signal path 194, and ADCs 14, 15.

As described above, image rejection accuracy is lowered, if amplitude and phase mismatches exist between the I and Q components in the input signal to the image rejecting circuit.

According to this embodiment, such disadvantage is not generated, because IQ mismatch is detected at the setting point of a plurality of frequencies within the frequency band of the image signal with the filter mismatch calibrating circuit and calibration is conducted to acquire the IRR of the predetermined value, for example, 50 dB or higher at any setting point. Namely, the filter mismatch detecting circuit (M_DETC) 310 detects amplitude mismatch and phase mismatch between these two demodulation outputs (I component and Q component). The received signal and the image signal outputted from the quadrature mixer 192 are inputted to the ADCs 14, 15 through the I component signal path 193 and the Q component signal path 194 for conversion into the digital signals. During this process, amplitude and phase mismatches depending on frequency are possibly generated between the I and Q components. Therefore, it is desirable to detect both amplitude mismatch and phase mismatch between a couple of input terminals of the image rejecting circuit (IRC) 26 (in other words, the output signals of the I component signal path and Q component signal path including the ADC).

Figure 6A:
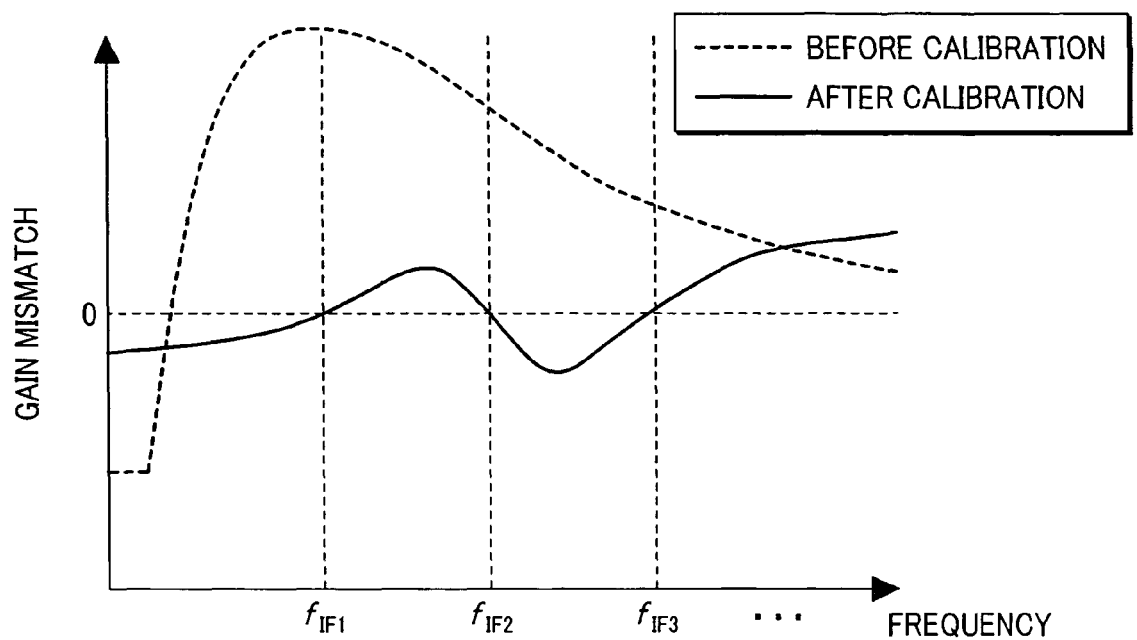
FIG. 6A is a diagram showing operation of a filter mismatch calibrating circuit of the first embodiment.
Figure 6B:
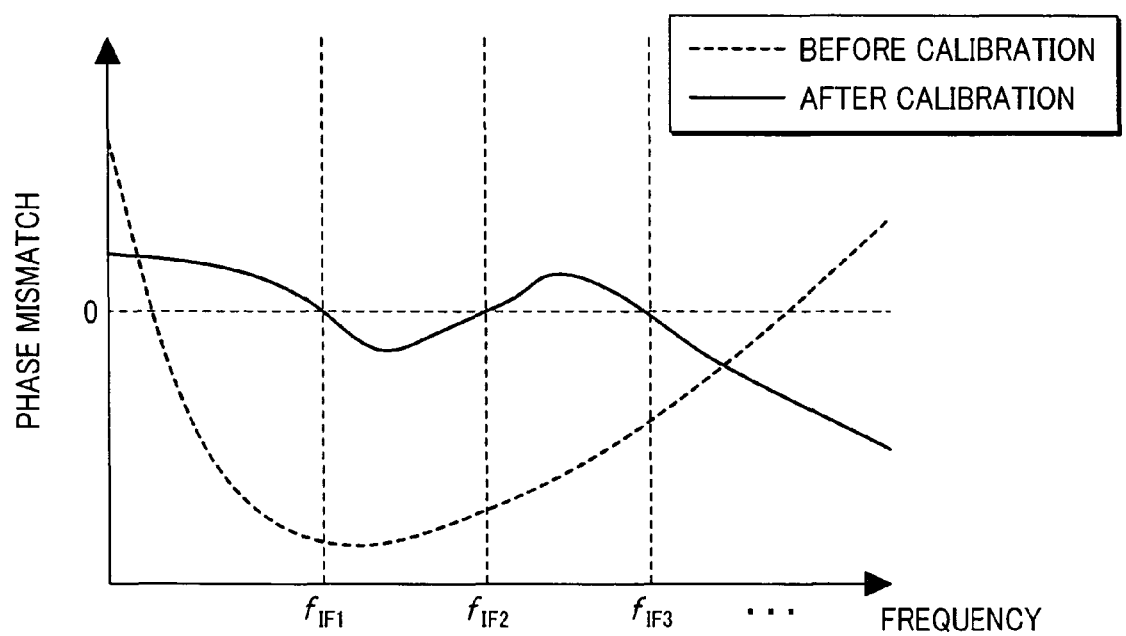
FIG. 6B is a diagram showing operation of the filter mismatch calibrating circuit of the first embodiment.

FIGS. 6A and 6B illustrate operations of the filter mismatch calibrating circuit of this embodiment. FIG. 6A illustrates an example of amplitude mismatch and frequency of IQ in the output of the filter mismatch calibrating circuit. A broken line illustrates an example of characteristic before calibration and a solid line, an example of characteristic after calibration. In this embodiment, calibration with the filter mismatch calibrating circuit 195 is conducted to acquire the IRR value equal to or higher than the predetermined value at the setting points of a plurality of frequencies on the basis of the detection result by the filter mismatch detecting circuit (M_DETC) 310. As described above, amplitude mismatch at $f_{IFi}$ can be set to zero by adequately selecting frequency characteristic of the calibration filter.

FIG. 6B illustrates an example of phase mismatch and frequency of IQ in an output of the filter mismatch calibrating circuit. A broken line indicates an example of characteristic before calibration, while a solid line, an example of characteristic after calibration. Calibration can be conducted at a plurality of setting points with a plurality of calibration signals $f_i$ as in the case of FIG. 6A. Phase mismatch at $f_{IFi}$ can be set to zero by adequately selecting frequency characteristic of the calibration filter.

Operation principle of the image rejecting circuit and relationship between calibration of IQ mismatch and image rejection of image will be explained with reference to FIGS. 7A to 7D. These figures illustrate I and Q on the IQ plane by means of vector indications.

Figure 7A:
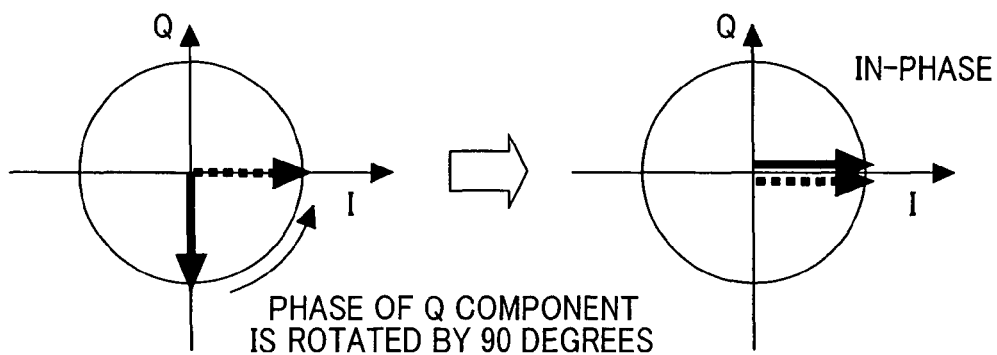
FIG. 7A is a diagram showing the operation principle of the image rejecting circuit.

First, FIG. 7A illustrates operations of I, Q vectors when the received signal is converted to the baseband frequency and mismatch exists in the amplitude and phase of I and Q components. The I and Q components of the received signal expressed with the Equations (4.1) and (4.2) are respectively expressed as:

$A(t)\cos(\omega_{IF}t+a)$ and $A(t)\sin(\omega_{IF}t+a)$.

Accordingly, the Q component (solid line) can be expressed as the vector delayed in phase by 90 degrees from the I component when the I component (dotted line) is defined as reference as illustrated in FIG. 7A. The image rejecting circuit can obtain an output of the I component by adding a couple of vectors after the phase of Q component is rotated for 90 degrees. In this case, a couple of vectors become the in-phase vectors as illustrated in the right side of FIG. 7A.

Figure 7B:
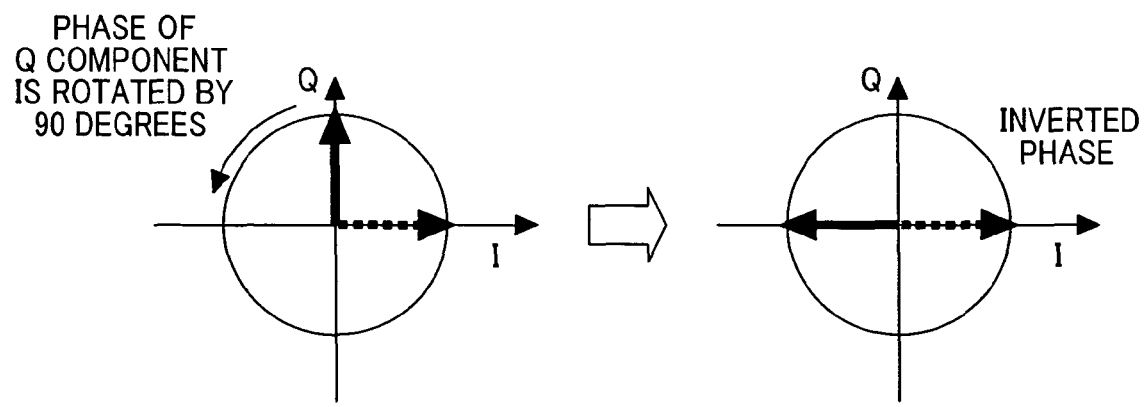
FIG. 7B is a diagram showing the operation principle of the image rejecting circuit.

Operations of I and Q vectors when the image signal is converted to the baseband frequency are illustrated in FIG. 7B. The I and Q components of the image signal expressed by the Equations (4.1) and (4.2) are respectively expressed as: $B(t)\cos(-\omega_{IF}t+\beta)$, and $B(t)\sin(-\omega_{IF}t+\beta)$. These Equations may be updated as: $B(t)\cos(f_{IF}t-\beta)$, $-B(t)\sin(\omega_{IF}t-\beta)$. Therefore, as illustrated in the left side of FIG. 7B, the Q component (solid line) can be expressed as the vector which is leading in phase for 90 degrees to the I component when the I component (dotted line) is defined as reference. The image rejecting circuit can obtain an output of the I component by adding a couple of vectors after the phase of Q component is rotated for 90 degrees like the above case. In this case, a couple of vectors are inverted in phase and the image signal is not outputted.

As explained above, the image rejecting circuit separates the received signal and image signal within the same frequency band by using difference in the sign of the Q components (sin component) in the received signal and image signal.

Next, operations of the I and Q vectors in the case where mismatch exists when the image signal is converted to the baseband frequency are illustrated in FIG. 7C and FIG. 7D.

When amplitude and phase mismatches exist between the I and Q components, operations are identical to that of FIG. 7B but the result is different. When the I component (dotted line) is defined as the reference, the Q component (solid line) can be expressed as the vector of different amplitude having the phase difference not equal to 90 degrees for the I component under the condition that the amplitude and phase mismatches exist between the I and Q components as illustrated in the left side of FIG. 7C. The image rejecting circuit adds a couple of vectors after the phase of the Q component is rotated for 90 degrees, but a couple vectors do not become the vectors inverted in phase as illustrated in the right side of FIG. 7C. Accordingly, the image signal is not cancelled and is then outputted to the baseband frequency.

However, according to the present embodiment, calibration is executed to make zero the amplitude mismatch and phase mismatch at a plurality of frequencies $f_{IFi}$ by adequately selecting frequency characteristic of the calibration filter.

Therefore, the digital received signal and image signal outputted from the ADCs 14, 15 are then inputted to the filter mismatch calibrating circuit (FIL_CAL) 195 and the IQ mismatch is calibrated for a plurality of frequencies $f_{IFi}$ in order to satisfy the communication standard (GSM standard).

Operations of the I, Q vectors in the case where mismatch of I, Q vectors is calibrated on the occasion of converting the image signal to the baseband frequency will be described with reference to FIG. 7D. The image rejecting circuit adds a couple of vectors after the phase of Q component is rotated for 90 degrees, but two vectors are opposed with each other as illustrated in the right side of FIG. 7D and thereby the image signal is cancelled and is not outputted to the baseband frequency. Namely, since mismatch of I, Q vectors to be inputted to the image rejecting circuit does not exist, the operations are identical to that of FIG. 7B.

Output of only the I component is considered above but above description may also be adapted to output of the Q component.

Since the IQ mismatch is calibrated in a plurality of frequencies $f_{IFi}$ with the filter mismatch calibrating circuit 195 as described above, the image rejecting circuit (IRC) 26 rejects the image with higher accuracy in the wider frequency band and thereby outputs only the received signal.

Since highly accurate image rejection is conducted in a plurality of frequencies, higher IRR can be obtained in wider range. The digital received signal outputted from the image rejecting circuit (IRC) 26 is inputted to the baseband circuit for the digital demodulation process.

Figure 8:
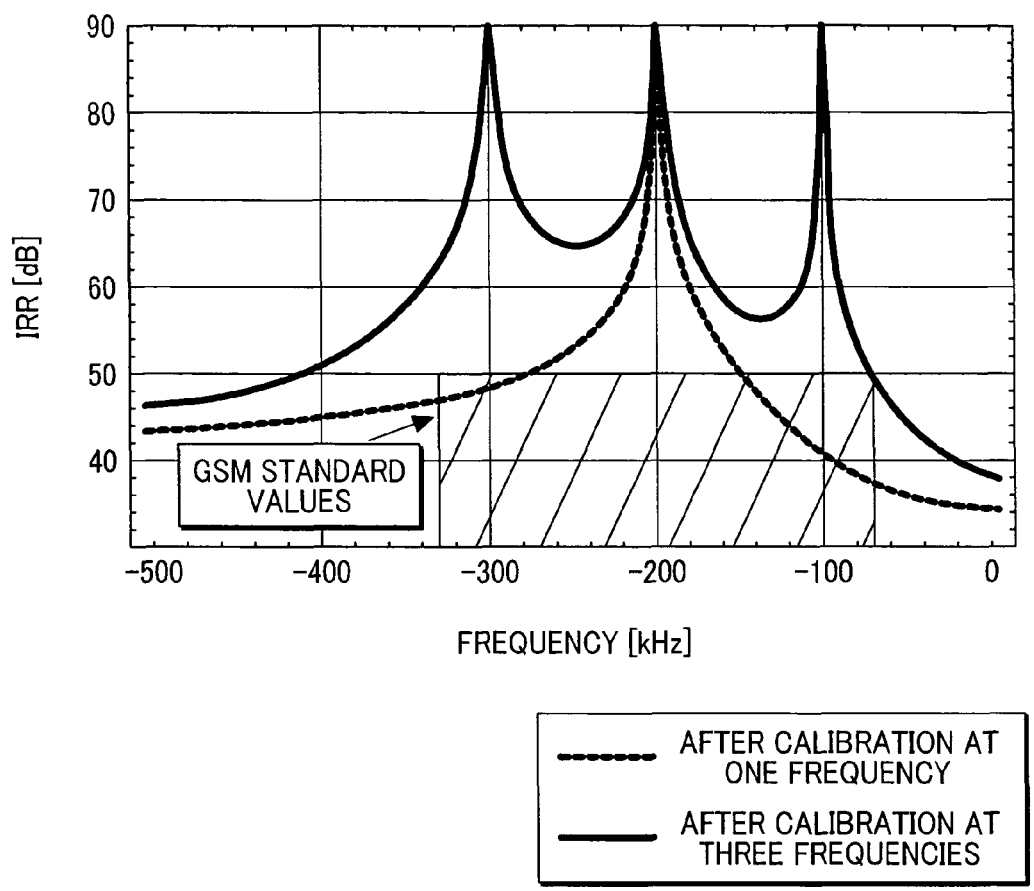
FIG. 8 is a diagram showing the effect of the first embodiment.

FIG. 8 illustrates relationship between frequency and IRR in the case where an IQ mismatch of 2% exists at the cut-off frequency of the third-order Bessel filter. IF is set to 200 kHz, sampling frequency is set to 1 MHz, $f_{IF1}$, $f_{IF2}$, $f_{IF3}$ are respectively set to 100 kHz, 200 kHz, and 300 kHz, namely, the number of frequencies N for calibration is set to 3 (N=3). According to FIG. 8, when the IQ mismatch is calibrated in one frequency (dotted line), sufficient IRR cannot be acquired within the signal frequency band in the If and thereby the GSM standard cannot be satisfied. Meanwhile, calibration is conducted in a plurality of frequencies (solid line), an IRR value can be improved to 50 dB or higher over the wider frequency band and thereby communication standard (GSM standard) can be satisfied to realize high quality communication.

The entire part or principal part of the filter mismatch calibrating unit, namely, the tap coefficient calculating circuit (T_CALC) 27, filter mismatch calibrating circuit (FIL_CAL) 195, calibration control circuit (CAL_ctl) 300 and filter mismatch detecting circuit (M_DETC) 310 may be constituted, in combination with the image rejecting circuit (IRC) 26, as a computer program having the calculation processing function to realize in the predetermined sequence the function described above through operations thereof on a computer. Moreover, such filter mismatch calibrating unit may also be constituted as a logic circuit to realize the function described above and in addition, it may also be constituted through combination of the computer program and the logic circuit.

Moreover, the calibration signal may be inputted from the external side at the time of delivery from a factory or may be inputted at the time of driving a mobile terminal or during the operation thereof by holding the calibration signal source within the terminal.

Although not illustrated in the figure, the calibration filter may be designed based on a function corresponding to mismatch to be detected or to correction value by previously providing such function into the receiver or may be designed based on a software provided in the baseband and mobile terminal.

According to this embodiment, as described above, the IQ mismatch depending on frequency is corrected and thereby image signal can be rejected in higher accuracy over wider frequency band, by conducting the linear transformation to the I, Q components in every $f_{IFi}$ at the setting points of a plurality of frequencies within the above frequency band in the manner that an image rejection ratio (IRR) of the image interfering signal to the desired received signal in the predetermined frequency band satisfies the standard required for the receiver.

Second Embodiment

The second embodiment of the present invention will be described with reference to FIG. 9 to FIGS. 19A and 19B. This embodiment corresponds to a receiver employing the low IF system.

Figure 9:
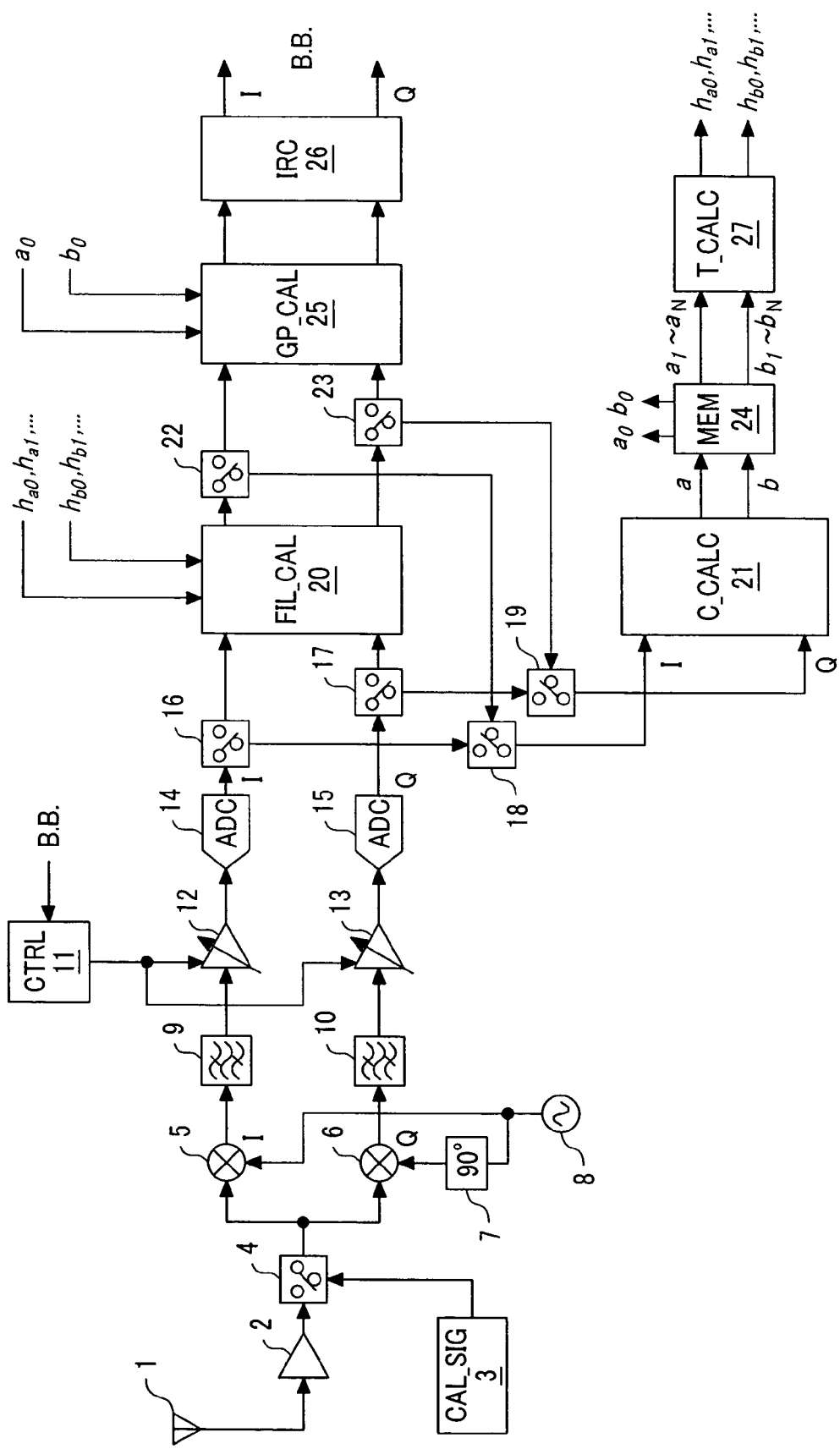
FIG. 9 is a structural diagram of a low IF receiver of a second embodiment of the present invention.

First, FIG. 9 illustrates a circuit structure of the low IF receiver as the second embodiment of the present invention. The low IF receiver illustrated in FIG. 9 comprises an antenna 1, an LNA 2, a calibration signal source 3, switches 4, 16 to 19, 22, 23, mixers 5, 6, an analog 90° phase shifter 7, an RF synthesizer 8, band-pass filters (BPFs) 9, 10, a control circuit 11, programmable gain amplifiers 12, 13, and analog/digital converters (ADCs) 14, 15. Moreover, the receiver also comprises a filter mismatch calibrating circuit (FIL_CAL) 20, a correction coefficient calculating circuit (C_CALC) 21, a memory (MEM) 24, an amplitude/phase mismatch calibrating circuit (GP_CAL) 25, an image rejecting circuit (IRC) 26, and a tap coefficient calculating circuit (T_CALC) 27.

This embodiment is characterized in that a filter mismatch calibrating unit is constituted with the calibration signal source 3, switches 4, 16 to 19, filter mismatch calibrating circuit (FIL_CAL) 20, correction coefficient calculating circuit (C_CALC) 21 for detecting filter mismatch and calculating correction coefficient to mismatch, memory (MEM) 24, amplitude/phase mismatch calibrating circuit (GP_CAL) 25, tap coefficient calculating circuit (T_CALC) 27, and calibration control circuit (not illustrated).

In FIG. 9, the received signal in the RF band received with the antenna 1 is amplified with the LNA 2 and is then inputted to the mixers 5, 6. Here, the low IF receiver generates the LO signal of the frequency lower by $f_{IF}$ than the RF frequency of the received signal with the RF synthesizer 8. The generated LO signal is then inputted to two mixers 5, 6 and one is then inputted in direct to the mixer 5, while the other, to the mixer 6 via the analog 90° phase shifter 7. The received signal and LO signal are multiplied with the mixers 5, 6 and the received signal is frequency-converted to the IF. Thereafter, noise near DC such as offset and flicker noise and out-of-band noise such as interfering signal are rejected with the BPFs 9, 10. Thereafter, the received signal is gain-adjusted with the PGAs 12, 13 and converted to the digital signal with the ADCs 14, 15. Gains of the PGAs 12, 13 are controlled via the control circuit (CTRL) 11 with the control signal from the baseband circuit (B.B.).

The receiver of this embodiment operates in the three operating modes of "filter mismatch calibrating mode" for calibrating mismatch depending on frequency generated in the BPFs 9, 10, "gain/phase mismatch calibrating mode" for calibrating mismatch not depending on frequency generated in the mixers 5, 6, PGAs 12, 13 and ADCs 14, 15, and "receiving mode" for receiving the RF signal and then converting it to the baseband signal.

Operations in each mode of the receiver of this embodiment will be described below.

Figure 10:
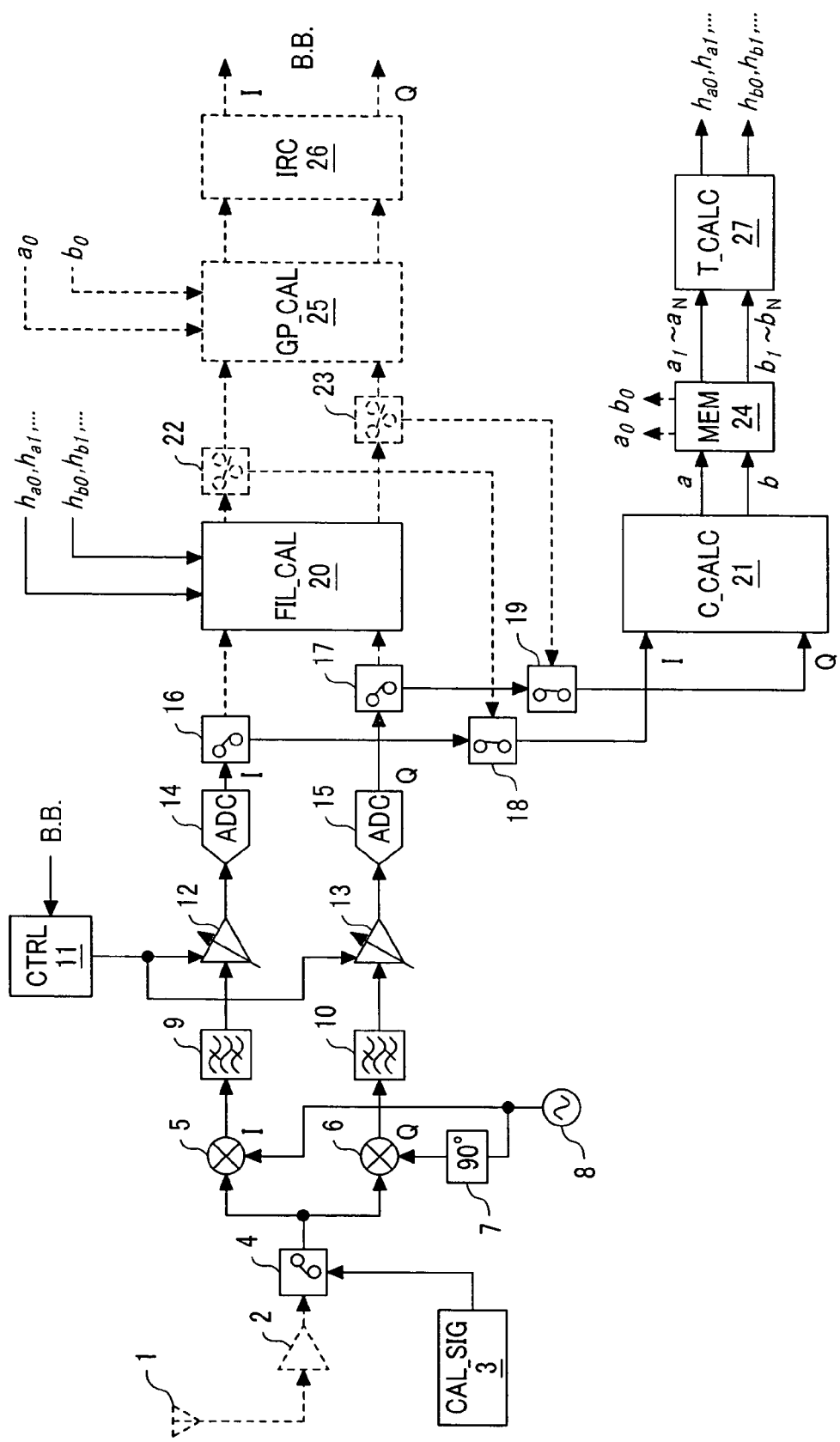
FIG. 10 is a structural diagram showing the receiver in the filter mismatch calibrating mode of the second embodiment.

Calibrating operation in the "filter mismatch calibrating mode" will be described with reference to FIG. 10. The filter mismatch calibrating mode is executed for calibrating mismatch depending on frequency generated by an analog filter of the receiver.

The calibration signal source 3 outputs a plurality of calibration signals of frequency $f_i$ and these calibration signals are inputted to the mixers 5, 6 via the switch 4. Here, the RF synthesizer 8 generates the LO signal of frequency $f_{LO}$. One of the LO signal is inputted in direct to the mixer 5 and the other is inputted to the mixer 6 via the analog 90° phase shifter 7. The calibration signal and LO signal are multiplied with each other in the mixers 5, 6 and these calibration signals are frequency-converted to a plurality of image signal frequencies $f_{IFi}$ in the IF frequency band. Hereinafter, an output of the mixer 5 is defined as the I component, while an output of the mixer 6 as the Q component. Thereafter, noise near DC such as DC offset and flicker noise and out-of-band noise of image signal are rejected with the BPFs 9, 10.

Thereafter, the calibration signal is subjected to gain adjustment with the PGAs 12, 13 and is then converted to the digital signal with the ADCs 14, 15. Gains of the PGAs 12, 13 are controlled via the control circuit (CTRL) 11 with the control signal from the baseband circuit (B.B.).

The I component and Q component of the calibration signal converted to the digital signal are respectively inputted to the correction coefficient calculating circuit (C_CALC) 21 via the switches 16, 18 and the switches 17, 19. The correction coefficient calculating circuit (C_CALC) 21 detects an IQ mismatch corresponding to the inputted digital calibration signal and calculates correction coefficients "a" and "b" for the mismatch. Structure and operations of the correction coefficient calculating circuit (C_CALC) 21 will be described later.

The correction coefficients "a" and "b" described above are respectively stored in the memory 24 as $a_i$ and $b_i$, when these are calculated based on the calibration signal of frequency $f_{IFi}$.

After the correction coefficients $a_i$ and $b_i$ for the frequency $f_{IFi}$ are obtained, the calibration signal source 3 switches the oscillation frequency from $f_i$ and outputs the calibration signal of frequency $f_{i+1}$. With the operations similar to that described above, the calibration signal of frequency $f_{IF(i+1)}$ is calculated based on the correction coefficients "a" and "b" and these are respectively stored in the memory 24 as $a_{i+1}$ and $b_{i+1}$.

With repetition of N times of such operations, the correction coefficients $a_1, a_2, \ldots, a_{N-1}, a_N$ and $b_1, b_2, \ldots, b_{N-1}, b_N$ for the calibration signal frequencies $f_{IF1}, f_{IF2}, \ldots, f_{IF(N-1)}, f_{IFN}$ in the IF band are calculated and stored in the memory.

The correction coefficients described above are inputted to the tap coefficient calculating circuit (T_CALC) 27. The tap coefficient calculating circuit (T_CALC) 27 designs a filter for calibrating an IQ mismatch depending on frequency based on the correction coefficient (also considered as a mismatch) for each frequency. The filter to be designed is a calibrating filter a (FIR_a) providing filter gains $a_1, a_2, \ldots, a_{N-1}, a_N$ to the frequencies $f_{IF1}, f_{IF2}, \ldots, f_{IF(N-1)}, f_{IFN}$ and a calibrating filter b (FIR_b) providing filter gains $b_1, b_2, \ldots, b_{N-1}, b_N$ to the frequencies $f_{IF1}, f_{IF2}, \ldots, f_{IF(N-1)}, f_{IFN}$.

The tap coefficient calculating circuit (T_CALC) 27 calculates tap coefficients $h_{a0}, h_{a1}, \ldots, h_{b0}, h_{bi}, \ldots$, of the calibrating filters FIR_a and FIR_b based on the correction coefficients explained above. Structure and operation of the tap coefficient calculating circuit (T_CALC) 27 will be explained later.

The tap coefficients explained above are inputted to the filter mismatch calibrating circuit (FIL_CAL) 20 for update thereof. Structure and operation of the filter mismatch calibrating circuit (FIL_CAL) 20 will be explained later.

Figure 11:
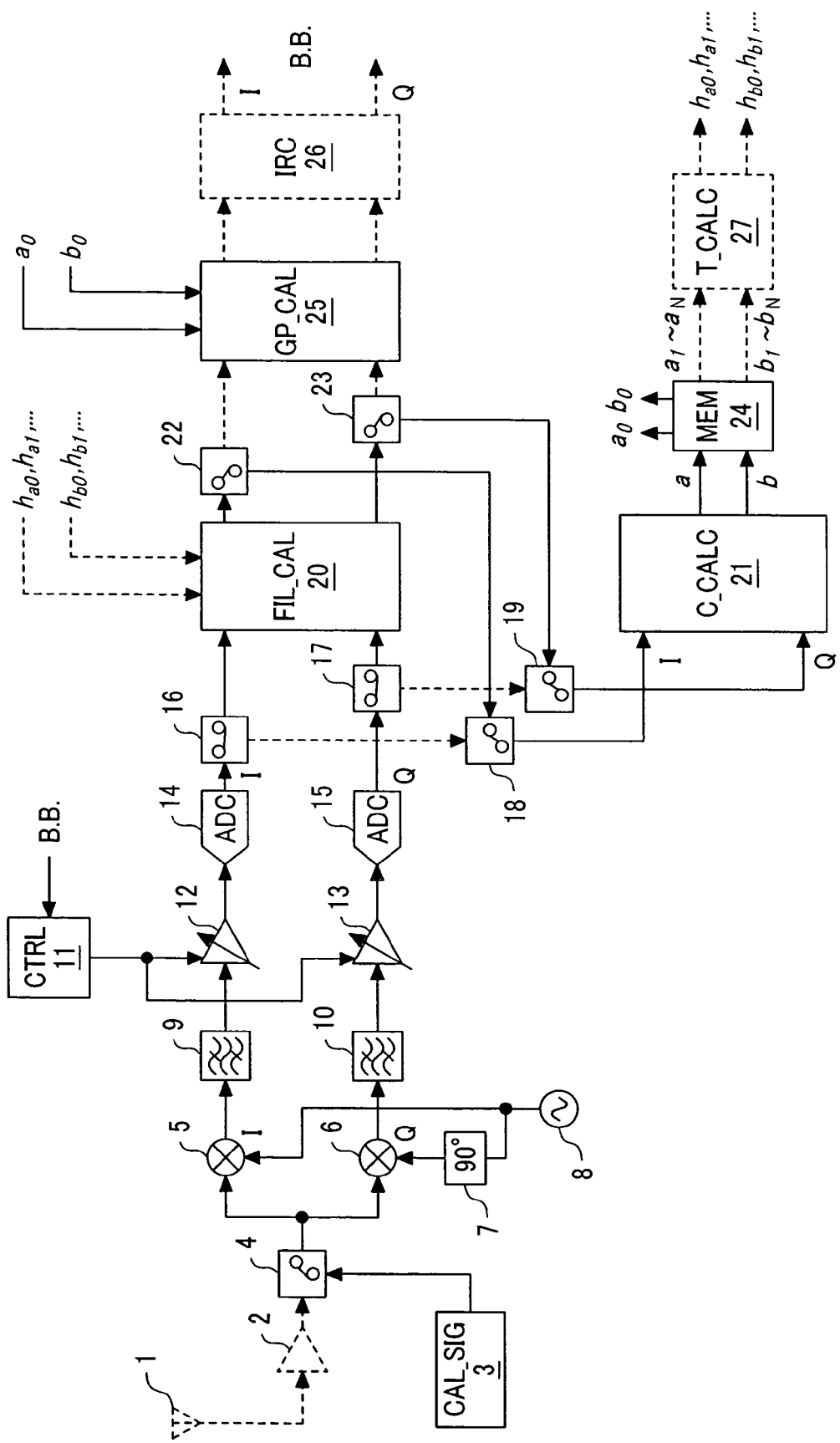
FIG. 11 is a structural diagram of the receiver in the gain/phase mismatch calibrating mode of the second embodiment.

Next, calibrating operation in the "gain/phase mismatch calibrating mode" will be explained with reference to FIG. 11. The gain/phase mismatch calibrating mode is executed for calibrating mismatch not depending on frequency generated in the mixers, PGAs, and ADCs of the receiver.

The calibration signal source 3 outputs the calibration signal of frequency $f_0$. Here, the frequency $f_0$ of the calibration signal is set to the image signal frequency $f_{LO}-f_{IF}$ of the receiving signal received immediately after this calibration signal. Structure and operation of the calibration signal source 3 will be explained later.

The calibration signal of frequency $f_0$ explained above is inputted to the mixers 5, 6 via the switch 4. Here, the RF synthesizer 8 generates the LO signal of frequency $f_{LO}$. One of the LO signal is inputted in direct to the mixer 5, while the other to the mixer 6 via the analog 90° phase shifter 7. The calibration signal and the LO signal are multiplied in the mixers 5 and 6, and the calibration signal is frequency-converted to the image signal frequency $f_{IFi}$ in the IF frequency band. Thereafter, noise near DC such as DC offset and flicker noise and out-of-band noise of image signal are rejected with the BPFs 9, 10.

The calibration signal is thereafter adjusted in the gain with the PGAs 12, 13 and then converted to the digital signal with the ADCs 14, 15. The gains of the PGAs 12, 13 are controlled via the control circuit (CTRL) 11 with the control signal from the baseband circuit (B.B.) in accordance with power of the receiving signal received immediately after the conversion.

The I and Q components of the calibration signal converted to the digital signal are inputted respectively to the filter mismatch calibrating circuit (FIL_CAL) 20 via the switch 16 and the switch 17, respectively. The filter mismatch calibrating circuit (FIL_CAL) 20 calibrates the IQ mismatch depending on the frequency generated in the signal path, particularly in the BPFs 9, 10 of IQ. Thereafter, the I component is inputted to the correction coefficient calculating circuit (C_CALC) 21 via the switches 22, 18, while the Q component via the switches 23, 19. The correction coefficient calculating circuit (C_CALC) 21 calculates an IQ mismatch for the input digital calibration signal and calculates the correction coefficients "a" and "b" for the mismatch. Structure and operation of the correction coefficient calculating circuit (C_CALC) 21 will be explained later.

The correction coefficients "a" and "b" explained above are stored in the memory 24, respectively as $a_0$ and $b_0$. The correction coefficients $a_0$ and $b_0$ are inputted to the amplitude/phase mismatch calibrating circuit (GP_CAL) 25 for update thereof. Structure and operation of the amplitude/phase mismatch calibrating circuit (GP_CAL) 25 will be explained later.

Figure 12:
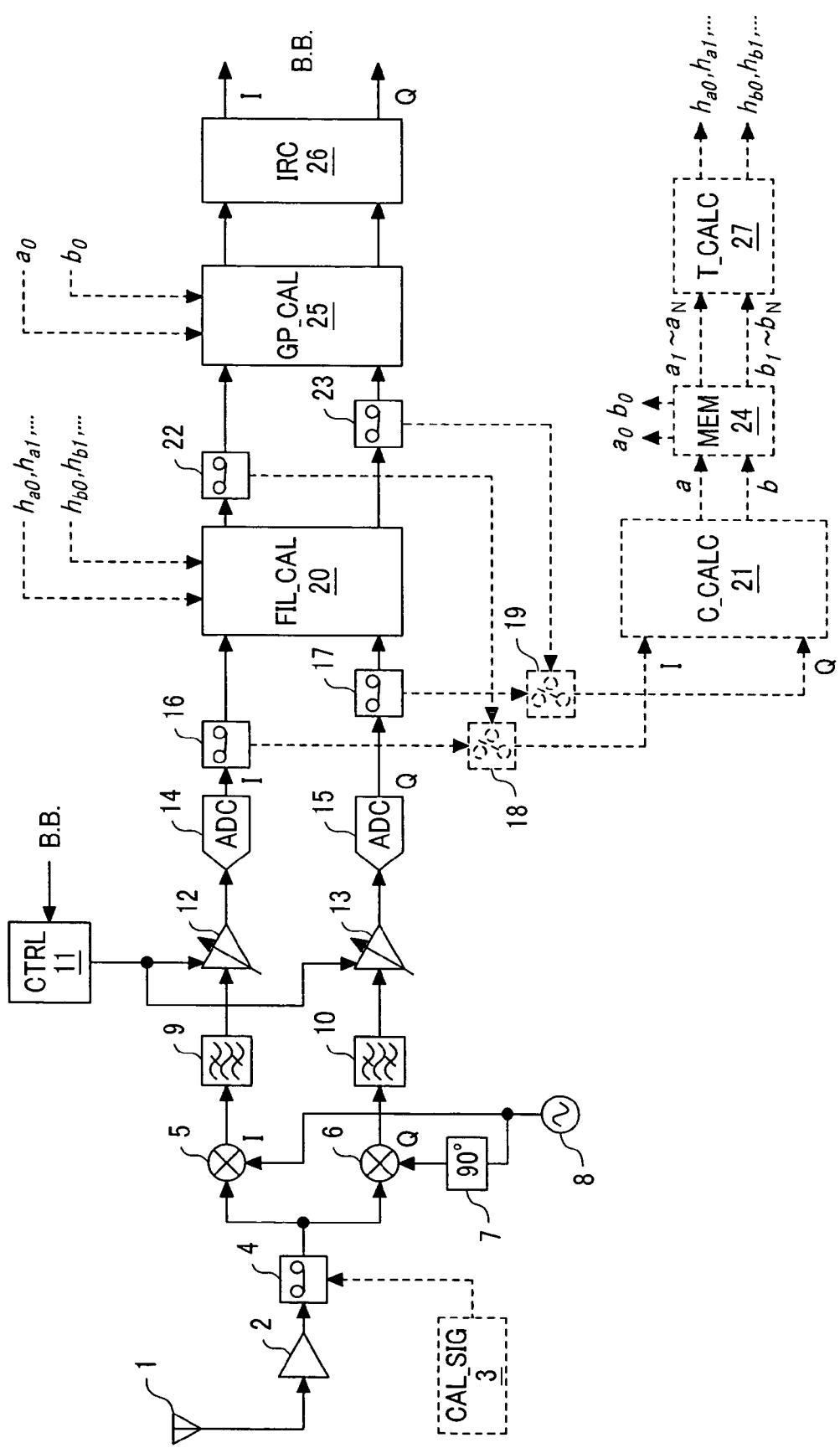
FIG. 12 is a structural diagram of the receiver in the receiving mode of the second embodiment.

Receiving operation in the "receiving mode" will be explained with reference to FIG. 12. The receiving mode is executed for receiving the RF signal and then converting it into the baseband signal. The received signal in the RF band received with the antenna 1 is amplified with the LNA 2 and is then inputted to the mixers 5, 6 via the switch 4. Here, the low IF receiver generates, with the RF synthesizer 8, the LO signal having the frequency which is lower by $f_{IF}$ than the RF frequency of the received signal. The generated LO signal is then inputted to two mixers 5, 6 and one of this LO signal is inputted in direct to the mixer 5, while the other is inputted to the mixer 6 via the analog 90° phase shifter 7. The received signal and the LO signal are multiplied in the mixers 5, 6 and the received signal is frequency-converted to the IF. Thereafter, noise near DC such as DC offset and flicker noise and the out-of-band noise of interfering signal are rejected with the BPFs 9, 10. The received signal is then subjected to gain adjustment with the PGAs 12, 13 and is converted to the digital signal with the ADCs 14, 15. Gains of PGAs 12, 13 are controlled via the control circuit (CTRL) 11 with the control signal from the baseband circuit (B.B.).

The digital received signals outputted from the ADCs 14, 15 are then inputted to the filter mismatch calibrating circuit (FIL_CAL) 20. The filter mismatch calibrating circuit (FIL_CAL) 20 calibrates the IQ mismatch depending on frequency generated in the signal path, particularly in the BPFs 9, 10 of IQ.

Thereafter, the digital received signal is inputted to the amplitude/phase mismatch calibrating circuit (GP_CAL) 25 via the switches 22, 23. The amplitude/phase mismatch calibrating circuit (GP_CAL) 25 calibrates the IQ mismatch not depending on frequency generated in the signal path, particularly in the mixers 5, 6, PGAs 12, 13 and ACDs 14, 15 of IQ.

The digital received signal outputted from the amplitude/phase mismatch calibrating circuit (GP_CAL) 25 is inputted to the image rejecting circuit (IRC) 26. When the image signal is received together with the received signal, the received signal and image signal are separated in higher accuracy in the image rejecting circuit (IRC) 26, because the amplitude/phase mismatch of IQ in the image signal frequency band is calibrated. Moreover, only the received signal can be outputted by executing channel filtering. The received signal outputted from the image rejecting circuit (IRC) is inputted to the baseband signal (B.B.) for the purpose of digital demodulating process.

The phase/amplitude calibrating unit may also be constituted to provide a function to satisfy the standard explained above by setting a single image rejection ratio at the setting point of the single frequency as the image rejection ratio (IRR) of the image interfering signal for the desired received signal in the predetermined frequency band of the quadrature mixer output.

Figure 13:
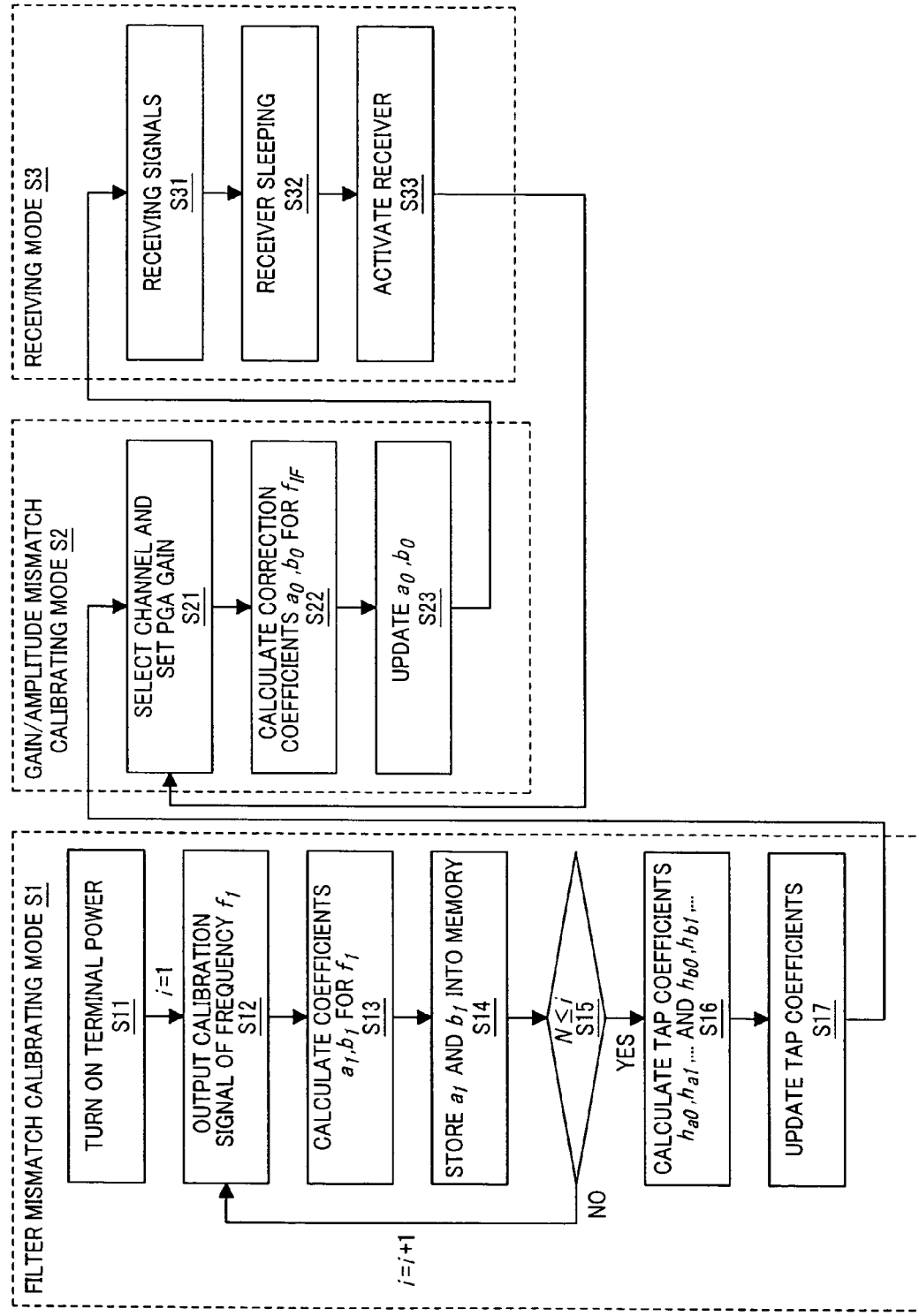
FIG. 13 is a flowchart showing an IQ mismatch calibration sequence of the second embodiment.

FIG. 13 shows a sequence for calibrating IQ mismatch of the receiver explained above. In this figure, S1 is the filter mismatch calibrating mode. In this filter mismatch calibration mode S1, after the power source of a terminal is turned ON first (S11), the calibration signal of frequency $f_i$ is inputted to the receiver (S12). Although not illustrated in the figure, the LO frequency and the gain of PGA are set to the desired setting values. For example, the lowest LO frequency and the minimum gain of PGA may also be set. On the basis of the calibration signal of frequency $f_i$, the IQ amplitude/phase mismatch of the receiver is detected and the correction coefficients $a_1$, $b_1$ for mismatch are calculated (S13). The correction coefficients $a_1$, $b_1$ are stored in the memory (S14).

Trials from S12 to S14 are repeated for N times. When repetitive trials up to S14 from S12 are under N times, the process returns to S12. When such repetitive trials are N times or more, the process goes to the next sequence (S15). With the repetitive trials up to S14 from S12, the correction coefficients $a_1, a_2, \ldots, a_{N-1}$, and $b_1, b_2, \ldots, b_{N-1}, b_N$ for a plurality of frequencies $f_{IF1}, f_{IF2}, \ldots, f_{IF(N-1)}, f_{IFN}$ in the IF band are stored in the memory.

On the basis of these correction coefficients, the tap coefficients $h_{a0}, h_{a1}, \ldots$ and $h_{b0}, h_{b1}, \ldots$ of the FIR_a and FIR_b explained later are calculated (S16) in order to update these values (S17).

S2 is the gain/phase mismatch calibrating mode. After update of the tap coefficients (S17), the information about frequency $f_{RF}$ and power of the received signal received immediately after such update are obtained from a baseband modem. Based on this information, the LO frequency and the gain of PGA are set (S21).

The calibration signal of image signal frequency is inputted to the receiver, correction coefficients $a_0$, $b_0$ of IQ mismatch for the image signal are calculated (S22), and values of the correction coefficients $a_0$, $b_0$ in the amplitude/phase mismatch calibrating circuit (GP_CAL) 25 are updated (S23).

Moreover, when the received signal is divided on the time axis with a plurality of burst signals, setting of a plurality of image rejection ratios is executed, in every reception of the burst signals, before reception of the burst signals. In this case, setting of a plurality of image rejection ratios in the setting point of a plurality of frequencies may be executed when the power switch of the receiver is turned ON and setting of the single image rejection ratio in the setting point of the single frequency may be executed, in every reception of the burst signals, before reception of the burst signals.

S3 is the receiving mode. After the values of the correction coefficients $a_0$, $b_0$ are updated (S23), the RF receiving signal is received from the antenna 1 (S31). Since the IQ amplitude/phase mismatch within the image signal frequency in the receiving path is calibrated before reception, even when the image signal is received together with the receiving signal, highly accurate image rejection can be executed in the image rejecting circuit (IRC) 26. When reception is completed, the receiver is set to the sleeping state until the next reception timing for the power saving purpose (S32). When the next reception timing has come, the receiver is activated (S33) again to operate in the gain/phase mismatch calibrating mode.

Since setting of LO frequency and gain of PGA is different in every selection of channel, the IQ mismatch to be added is also different. However, according to this embodiment, since calibration is conducted by executing the gain/phase mismatch mode just before the receiving mode, the image rejection can always be realized in higher IRR value.

Moreover, it is also possible that the correction coefficients for mismatch in every setting of the LO frequency and gain of PGA are calculated after the end of the filter mismatch calibrating mode (S1) and these coefficients may be previously stored in the storage medium such as memory. In this case, calibration before the signal reception is no longer required, because it is enough to read the correction coefficients from the storage medium when the signal is received.

Figure 14:
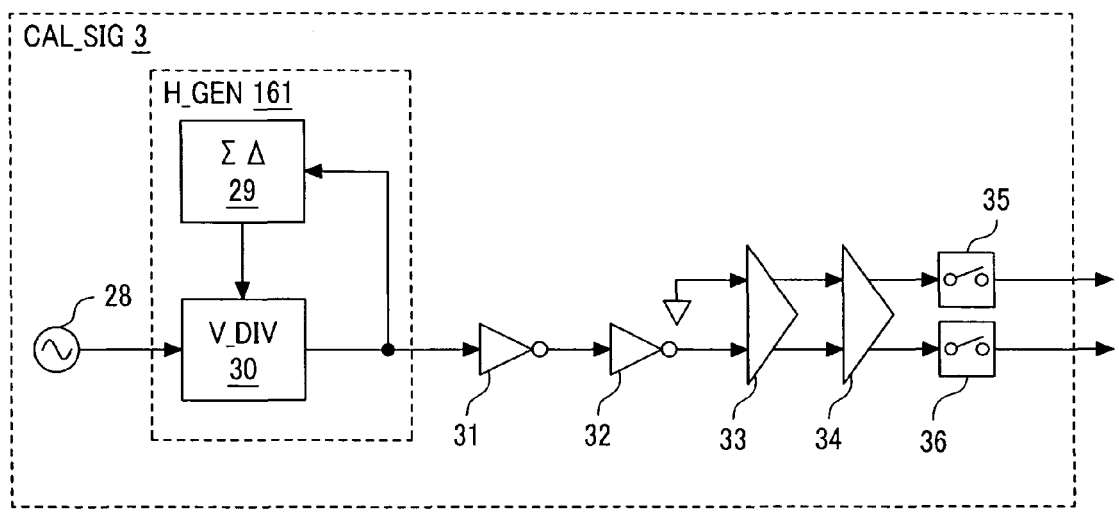
FIG. 14 is a structural diagram of a calibration signal source of the second embodiment of the present invention.

FIG. 14 shows an example of structure of the calibration signal source 3 of this embodiment. The calibration signal source 3 shown in FIG. 4 is constituted with inclusion of an RF synthesizer 28, a harmonics generating circuit 161, inverters 31, 32, differential amplifiers 33, 34, and switches 35, 36.

In the structure of FIG. 4, the calibration signal is generated. Namely, the RF signal generated by the RF synthesizer 28 is inputted to the harmonics generating circuit 161. The RF synthesizer 28 is capable of reducing increase in the circuit area by utilizing the RF synthesizer 8 shown in FIG. 1. The harmonics generating circuit 161 operates to divide fractionally the frequency of input RF signal and to obtain the fractional harmonic signal thereof as the calibration signal.

The harmonics generating circuit 161 is formed of a variable frequency-divider (V_DIV) 30 and a sigma/delta (ΣΔ) converter 29 to fractionally divide the frequency of the input RF signal. An output signal from the harmonics generating circuit 161 is inputted to an inverter 31. The inverters 31, 32 generate rectangular signals and increase electrical power of higher-order harmonics component. Moreover, the rectangular waves outputted from the inverters 31, 32 are amplified with the differential amplifiers 33, 34 and are then outputted via the switches 35, 36. The rectangular waves include higher-order harmonics and the harmonic of the particular order number among these harmonics is used as the calibration signal.

Frequency of the RF synthesizer is defined as $f_{LO}$, frequency dividing ratio of the variable frequency-divider (V_DIV) 30 as 1, order number of the harmonics as m, the calibration signal frequency $f_n$ is expressed as follows.

$$fn = f_{LO} \div 1 \times m$$

The harmonics other than the harmonic of order number m are also inputted to the receiver but since unwanted harmonics components are attenuated with the BPFs 9, 10 in FIG. 1, the digital calibration signal inputted to the correction coefficient calculating circuit (C_CALC) 21 is the signal near the tone signal.

The amplifier for amplifying the rectangular wave is aimed at amplifying the harmonics and it is not required to be the differential amplifier. The calibration signal source used here is capable of changing frequency within a short period of time by introducing the frequency division with the sigma/delta (ΣΔ) converter 29. Moreover, the frequency may also be varied using the mixer at the time of generating the RF calibration signal but calculation of the correction coefficients is sometimes interfered with generation of the image signal in the frequency near the frequency of the calibration signal. Generation of excessive noise in the frequency near the frequency of the calibration signal can be prevented by using harmonics as the calibration signal.

Figure 15:
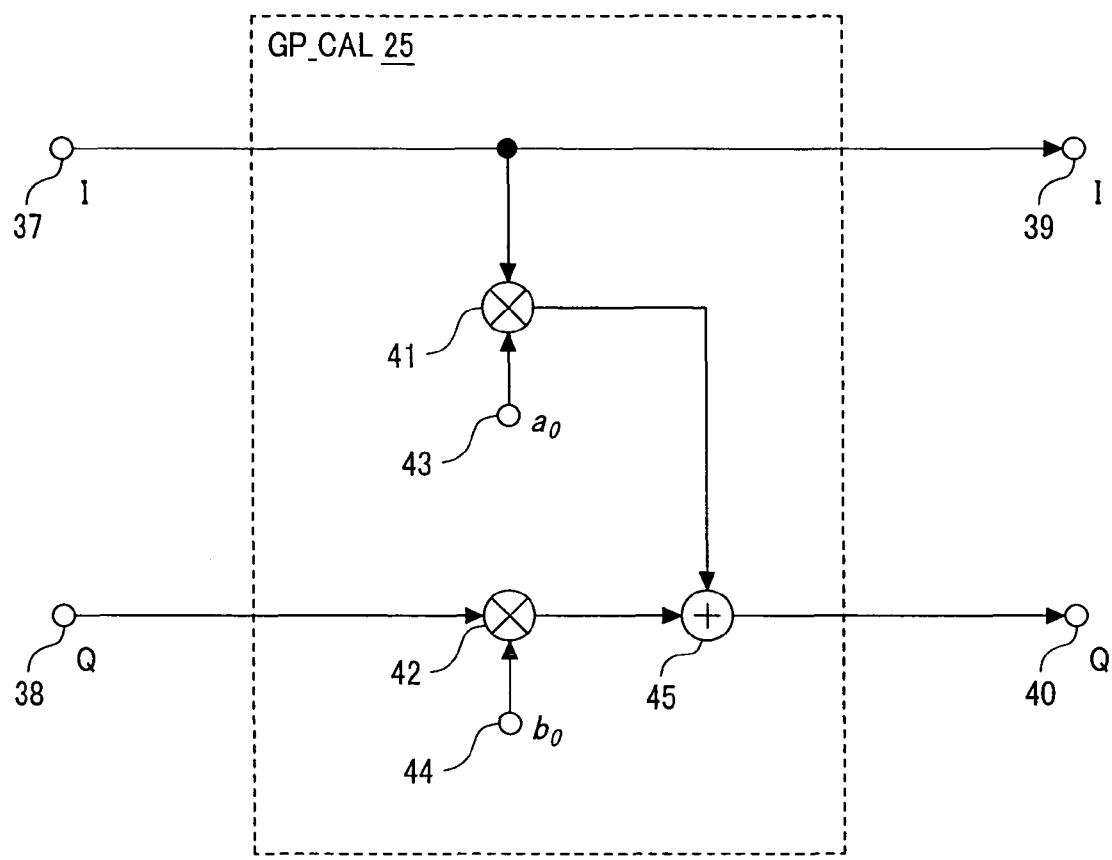
FIG. 15 is a structural diagram of an amplitude/phase calibrating circuit of the second embodiment.

FIG. 15 shows an example of structure of the amplitude/phase mismatch calibrating circuit (GP_CAL) 25 in this embodiment. The amplitude/phase mismatch circuit (GP_CAL) 25 shown in this figure is constituted with inclusion of input terminals 37, 38, 43, 44, digital multipliers 41, 42, a digital adder 45, and output terminals 39, 40.

Figure 24:
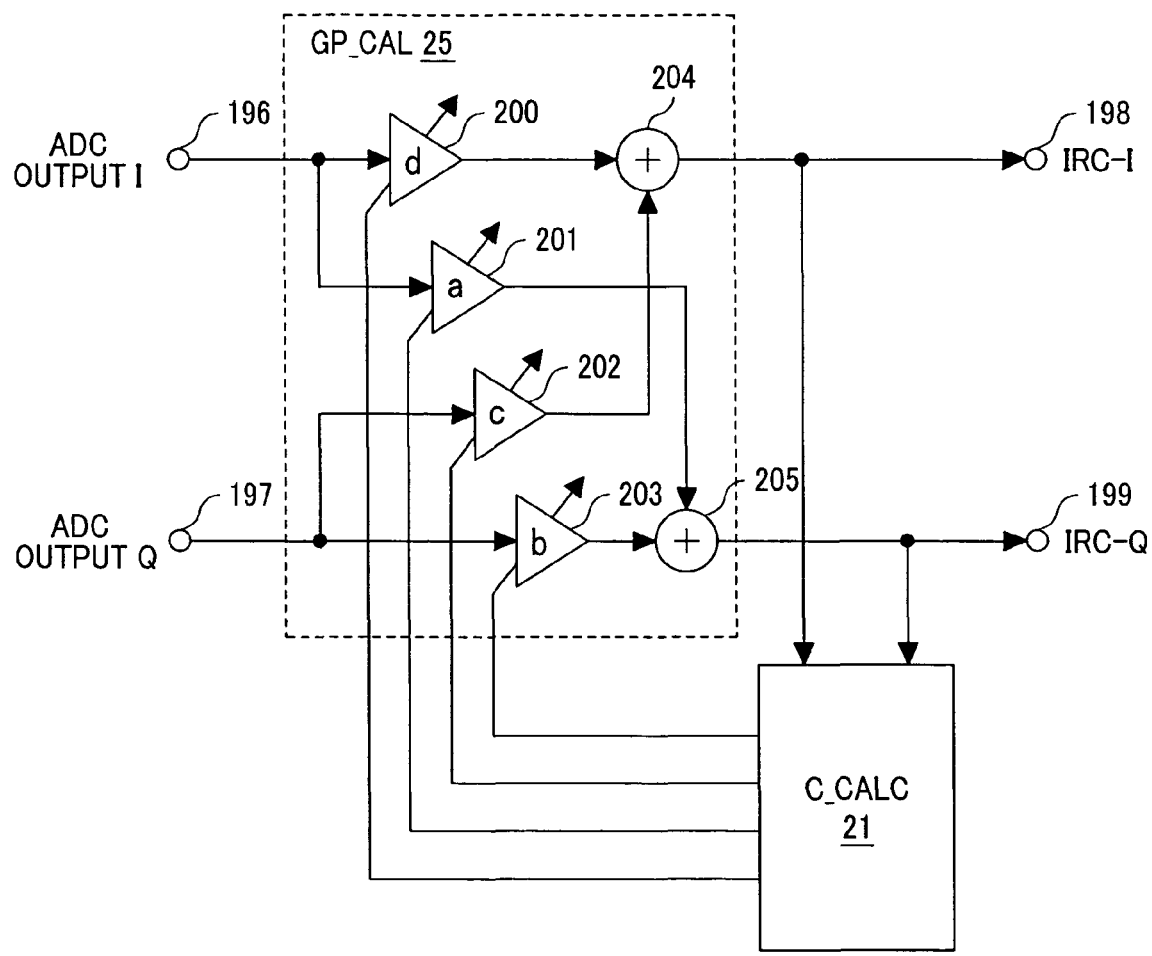
FIG. 24 is a structural diagram of the IQ mismatch calibrating circuit of the related prior art.
Figure 25:
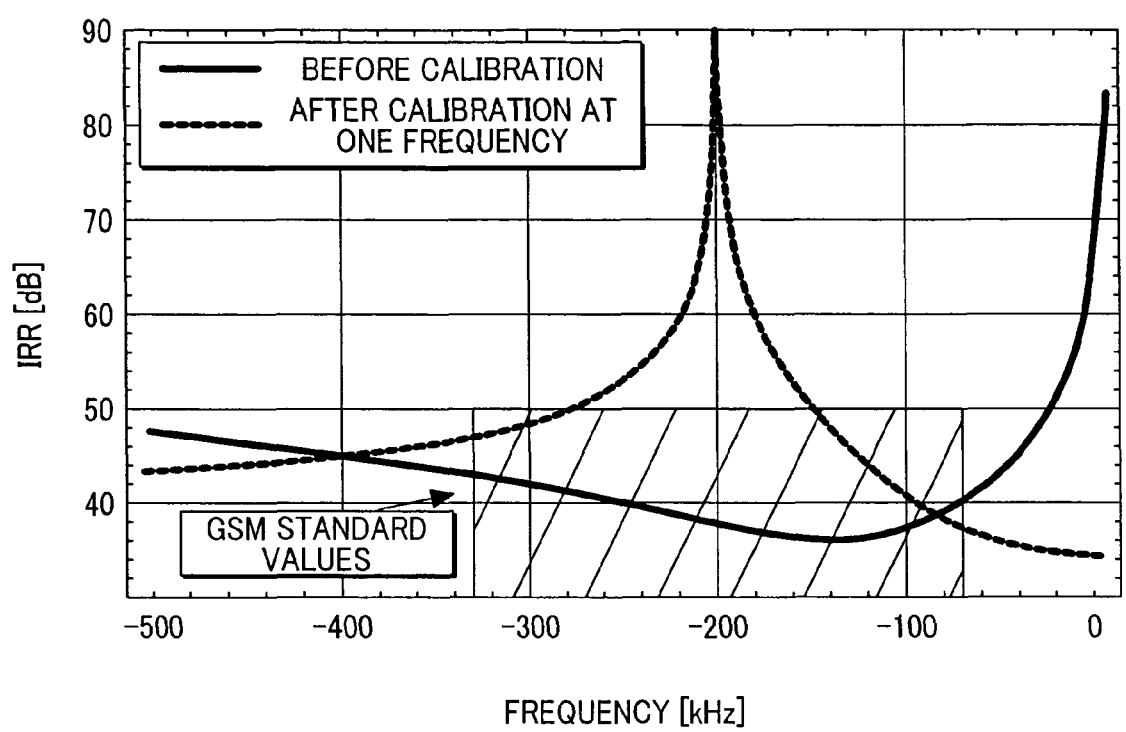
FIG. 25 is a diagram showing problems in the related prior art.

The structure of FIG. 15 is equivalent to the structure of the gain/phase mismatch calibrating circuit of FIG. 24 (related art) where b is equal to 1 and c is equal to 0. Based on this structure, the amplitude and phase of the Q component signal can be varied by using the I component signal. For example, it is assumed here that the signals of $C(t)\cos \omega_{IF}t$, and $C(t)\gamma \sin(\omega_{IF}t+\theta)$ are inputted respectively to the input terminals 37, 38. Here, C(t) is defined as amplitude of input signal, $\omega_{IF}$ as angular frequency of the input signal, t as time, γ as amplitude mismatch, and θ as phase mismatch. An output CQ from the digital adder 45 is expressed by the following Equation (5.1) because of the structure shown in the figure and is moreover expressed by the Equation (5.2).

$$CQ = a_0 \cdot C(t) \cdot \cos(\omega_{IF}t) + b_0 \cdot C(t) \cdot \gamma \cdot \sin(\omega_{IF}t + \theta) \quad (5.1)$$
$$= C(t)\sqrt{a_0^2 + 2\gamma a_0 b_0 \sin\theta + b_0^2 \gamma^2} \sin(\omega_{IF}t + d)$$

Where, $$d = \tan^{-1}\left(\frac{a_0 + b_0\gamma\sin\theta}{b_0\gamma\cos\theta}\right) \quad (5.2)$$

Here, the signal of Q component freed from a mismatch to the I component can be obtained by selecting the values of $a_0$ and $b_0$ satisfying the following Equation (5.3).

$$a_0^2 + 2\gamma a_0 b_0 \sin\theta + b_0^2\gamma^2 = 1, \text{ and}$$
$$a_0 + b_0\gamma \sin\theta = 0 \quad (5.3)$$

Figure 16:
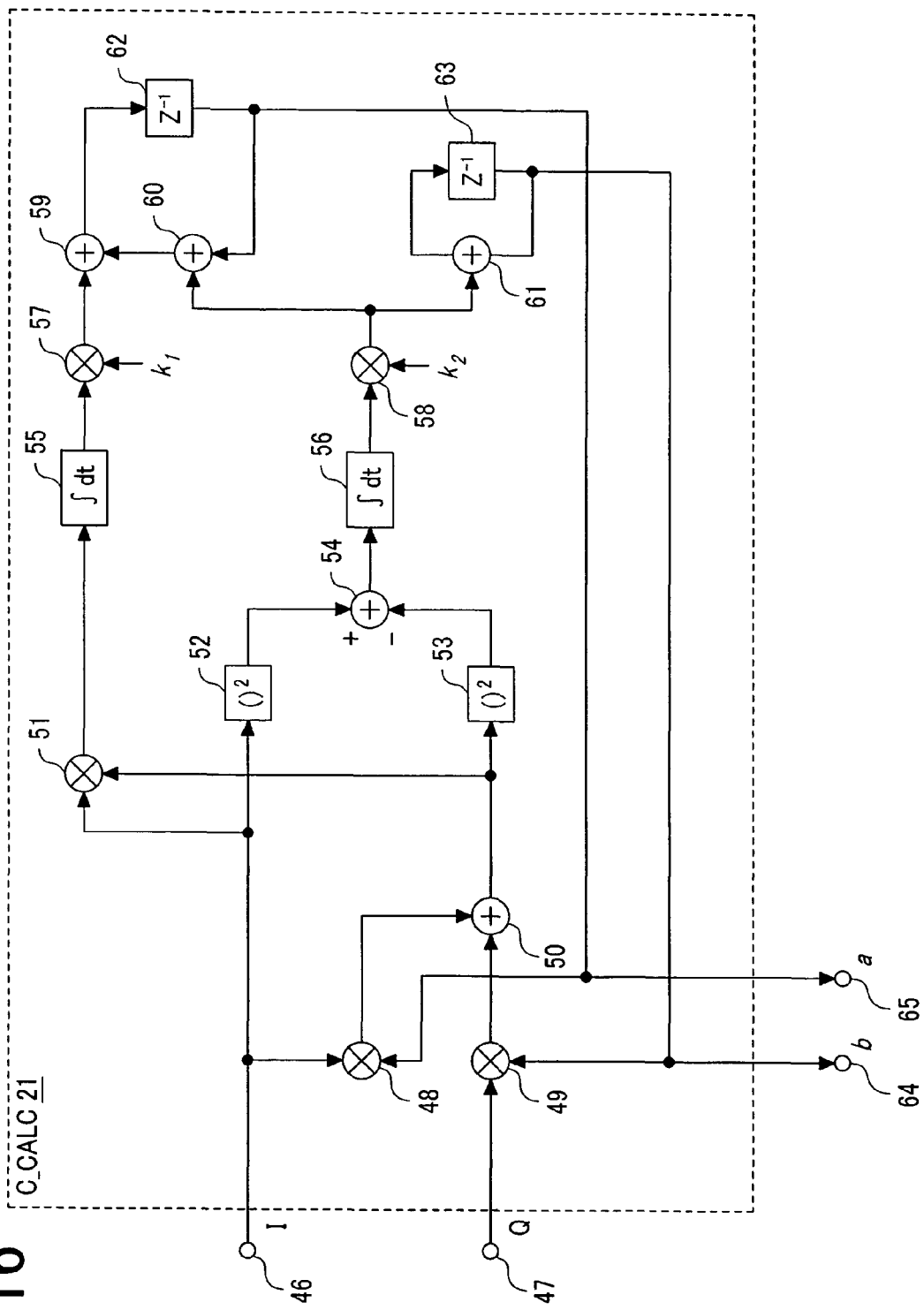
FIG. 16 is a structural diagram of a correction coefficient calculating circuit of the second embodiment.

FIG. 16 shows an example of structure of the correction coefficient calculating circuit (C_CALC) 21 in this embodiment. The correction coefficient calculating circuit (C_CALC) 21 shown in the figure is constituted with inclusion of input terminals 46, 47, digital multipliers 48, 49, 51, 57, 58, digital adders 50, 59, 60, 61, digital squarers 52, 53, a digital subtractor 54, digital integrators 55, 56, delay units 62, 63, and output terminals 64, 65.

With the structure shown in the figure, the correction coefficients "a" and "b" for amplitude and phase mismatches of the I and Q components in the quadrature demodulation signal are calculated. A structure formed of the digital multipliers 48, 49 and digital adder 50 operates based on the principle of the Equations (5.2) and (5.3) and can vary the amplitude and phase of the Q component by varying the values of "a" and "b".

A phase mismatch is detected with the digital multiplier 51 and digital integrator 55. Outputs of the digital squarers 52, 53 are subtracted each other with the digital subtractor 54 and then integrated with the digital integrator 56 in order to detect again (electrical power) mismatch. If the amplitudes of the I component of the quadrature demodulation signal inputted from the input terminal 46 and the Q component outputted from the adder 50 are identical and phase difference thereof is accurately 90 degrees, outputs from the integrators 55, 56 becomes zero.

However, when a mismatch exists between the I and Q components, the integrators 55, 56 output non-zero error components $E_a$ and $E_p$. The error components $E_a$ and $E_p$ are subjected to gain adjustment with the multipliers 57, 58, thereafter integrated with the digital adders 59 to 61, and delay units 62, 63, and are then fed back to the multipliers 48, 49 as the coefficients "a" and "b". The correction coefficient calculating circuit (C_CALC) 21 executes calculation for conversion to approximate mismatches $E_a$ and $E_p$ to zero by repeating detection of mismatches $E_a$ and $E_p$ between the I and Q components and update of the correction coefficients "a" and "b". In this structure, values of "a" and "b" are updated in accordance with the Equations (5.4) and (5.5).

$$a^{(i)} = a^{(i-1)} + k_2 E_a^{(i-1)} \quad (5.4)$$

$$b^{(i)} = b^{(i-1)} + k_1 E_p^{(i-1)} + k_2 E_a^{(i-1)} \quad (5.5)$$

Here, $k_1$ and $k_2$ are step gains and are desired constants where the absolute values thereof are smaller than 1. Moreover, $a^{(i)}$ and $b^{(i)}$ are correction coefficients "a", "b" updated by the (i)th update.

As indicated by the Equations (5.4) and (5.5), new estimated values can be obtained by adding the weighted error components to the old estimated values expressed by the Equations (5.4) and (5.5).

Figure 17:
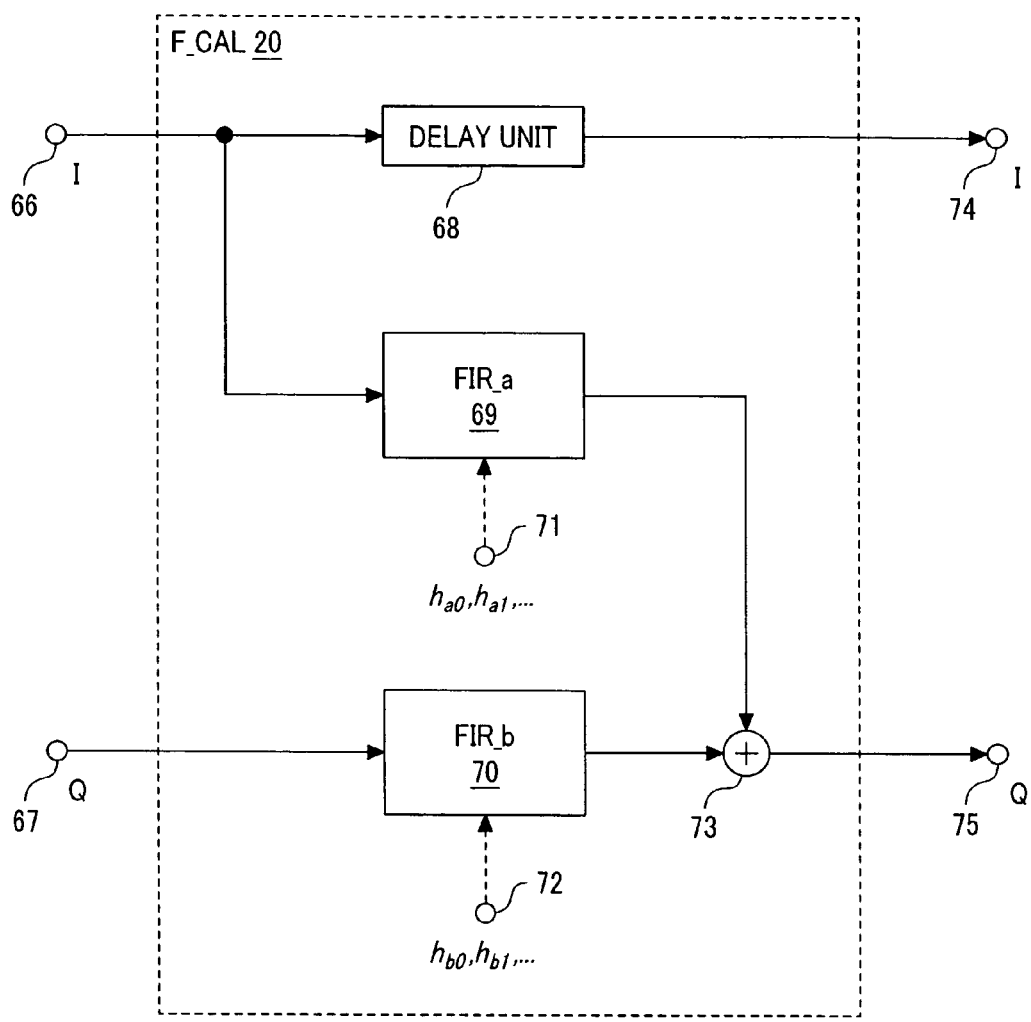
FIG. 17 is a structural diagram of a filter calibrating circuit of the second embodiment.

FIG. 17 shows an example of structure of the filter mismatch calibrating circuit (FIL_CAL) 20 of this embodiment. The filter mismatch calibrating circuit (FIL_CAL) 20 shown in this figure is constituted with inclusion of input terminals 66, 67, 71, 72, a delay unit 68, a calibrating filter a (FIR_a) 69, a calibrating filter b (FIR_b) 70, a digital adder 73, and output terminals 74, 75.

The structure of FIG. 17 corresponds to the filter mismatch calibrating circuit in FIG. 1 where $f_c(z)$ is equal to 0, while $f_d(z)$ is equal to 1. In this embodiment, $f_a(z)$ and $f_b(z)$ are set to the frequency characteristic of the FIR filter. The FIR filter can provide a linear phase as the phase characteristic by symmetrically setting the tap coefficients. Since it is enough when consideration is taken into account only for the gain characteristic, design can be simplified. Moreover, when the FIR filter is used, it is recommended to use the FIR filter of the odd-number order which can realize every type of the filter. The structure explained above can provide the effect for correcting mismatch depending on filter of both amplitude and phase of the I and Q components in the quadrature demodulation signal.

The I component of the calibration signal inputted from the input terminal 66 is outputted, in one hand, to the output terminal 74 with addition of delay similar to that of the calibrating filter a (FIR_a) 69 and the calibrating filter b (FIR_b) with the delay unit 68. On the other hand, this I component is inputted to the digital adder 73 via the calibrating filter a (FIR_a) 69. The Q component of the calibration signal inputted from the input terminal 67 is inputted to the digital adder 73 via the calibrating filter b (FIR_b) 70.

Figure 18A:
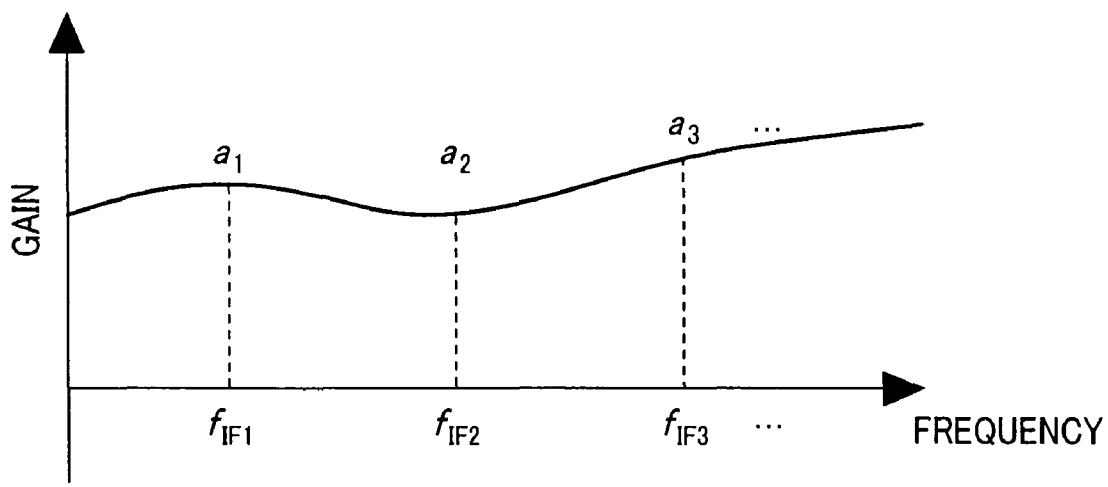
FIG. 18A is a diagram showing a frequency characteristic of a calibrating filter "a" of the second embodiment.

The filter FIR_a reads the tap coefficients $h_{a0}$, $h_{a1}$, . . . calculated by the tap coefficient calculating circuit (T_CALC) 27. Owing to the tap coefficients, the frequency characteristic $f_a(z)$ of the filter FIR_a has the gains $a_1$, $a_2$, . . . , $a_{N-1}$, $a_N$ at the frequencies $f_{IF1}$, $f_{IF2}$, . . . , $f_{IF(N-1)}$, $f_{IFN}$ as shown in FIG. 18A.

Figure 18B:
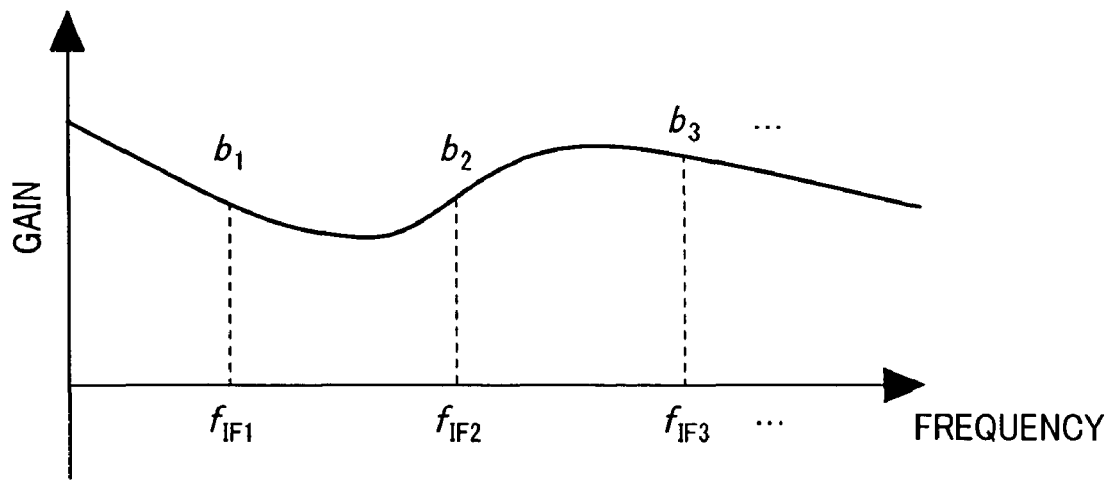
FIG. 18B is a diagram showing a frequency characteristic of a calibrating filter "b" of the second embodiment.

In the same manner, the filter FIR_b reads the tap coefficients $h_{b0}$, $h_{b1}$, . . . calculated by the tap coefficient calculating circuit (T_CALC) 27. Owing to the tap coefficients, the frequency characteristic $f_b(z)$ of the filter FIR_b has the gains $b_1$, $b_2$, . . . , $b_{N-1}$, $b_N$ at the frequencies $f_{IF1}$, $f_{IF2}$, . . . , $f_{IF(N-1)}$, $f_{IFN}$ as shown in FIG. 18B.

At the respective frequencies $f_{IF1}$, $f_{IF2}$, . . . , $f_{IF(N-1)}$, $f_{IFN}$, outputs of the delay unit 68 and digital adder 73 satisfy the relationship similar to that of the Equations (5.1) to (5.3). Accordingly, the IQ mismatch can be reduced within the wider frequency band.

Here, an example of FIG. 17 shows the case where both calibrating filter a (FIR_a) 69 and the calibrating filter b (FIR_b) 70 are defined as the FIR filter. In the case where the other filter, for example, the IIR filter is used, the delay unit 68 is adequately set to make equal the amounts of delay of the I and Q components.

Figure 19A:
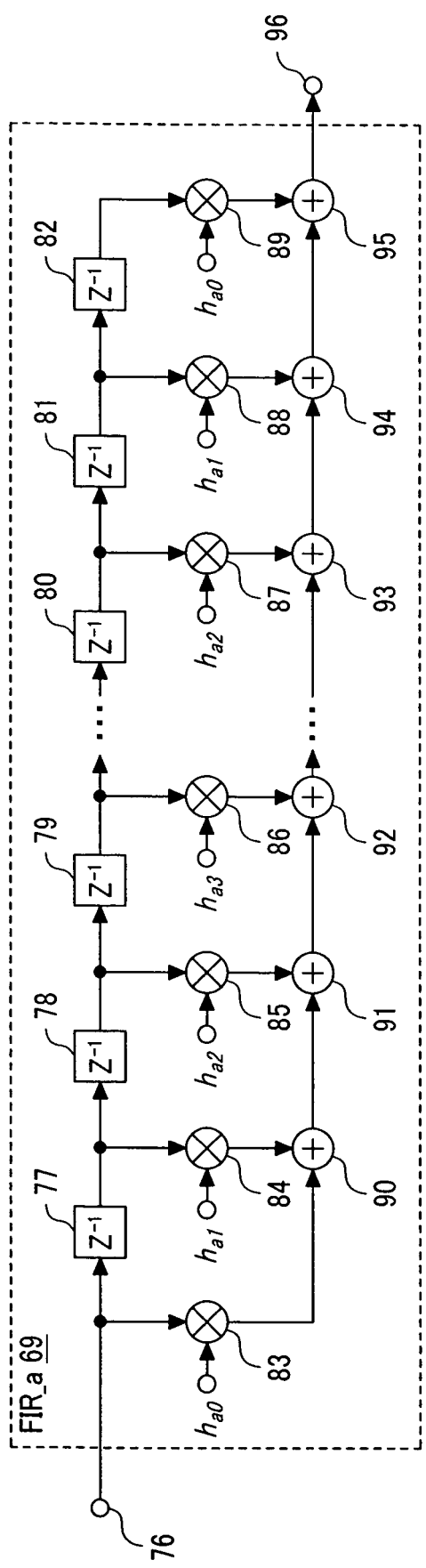
FIG. 19A is a structural diagram of the calibrating filter "a" of the second embodiment.

FIG. 19A shows an example of the structure of the calibrating filter a (FIR_a) in this embodiment. The calibrating filter a (FIR_a) 69 shown in this figure is an FIR filter constituted with inclusion of an input terminal 76, delay units 77 to 82, digital multipliers 83 to 89, digital adders 90 to 95, and output terminal 96. The input signal from the input terminal 76, output signals from the delay units 77 to 82 cascade connected in multiple stages, and the tap coefficients are multiplied in the digital multipliers 83 to 89. Moreover, multiplication result is added with the digital adders 90 to 95 and is then outputted to the output terminal 96.

Figure 19B:
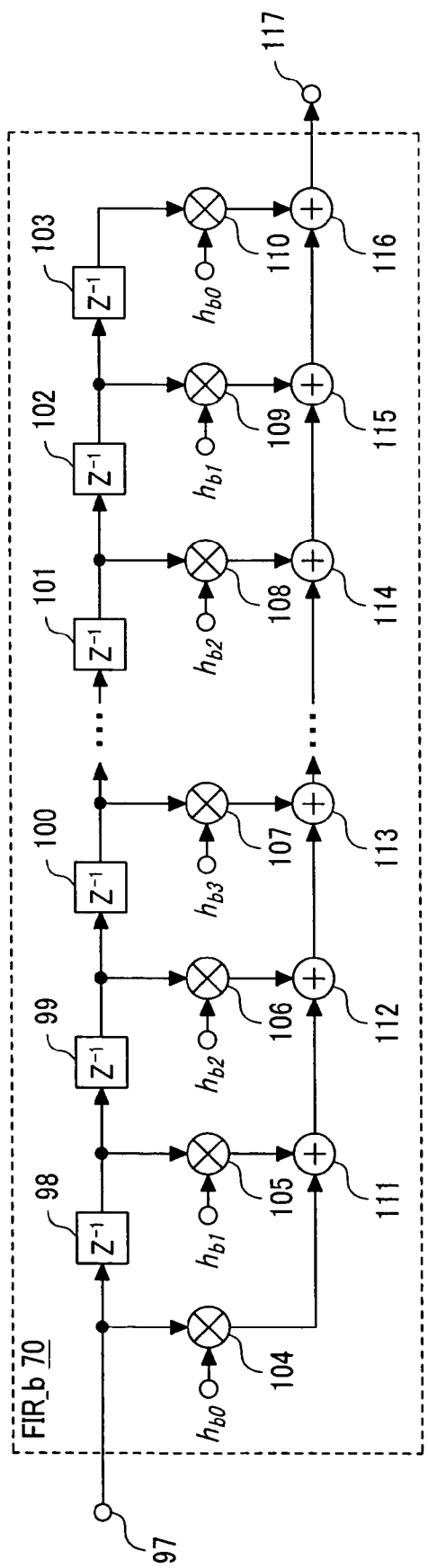
FIG. 19B is a structural diagram of the calibrating filter "b" of the second embodiment.

FIG. 19B shows an example of structure of the calibrating filter b (FIR_b) in this embodiment. The calibrating filter b (FIR_b) 70 shown in this figure is an FIR filter and is constituted with inclusion of an input terminal 97, delay units 98 to 103, digital multipliers 104 to 110, digital adders 111 to 116, and an output terminal 117. Input signal from the input terminal 97, output signal from the delay units 98 to 103 cascade connected in multiple stages, and the tap coefficients are multiplied in the digital multipliers 104 to 110. Moreover, multiplication result is added with the digital adders 111 to 116 and is then outputted to the output terminal 117.

In this embodiment, the calibrating filter a (FIR_a) 69 and calibrating filter b (FIR_b) 70 are designed as the coefficient symmetry type FIR filters but the order number may be set in the desired order. Moreover, order number of the filter is determined in accordance with bandwidth and accuracy required for the IQ mismatch and amount of hardware to be mounted. In addition, the calibrating filter a (FIR_a) 69 and calibrating filter b (FIR_b) 70 may be realized with the filters other than the FIR filter.

The tap coefficient calculating method of the calibrating filter in the tap coefficient calculating circuit (T_CALC) 27 will be explained. In the example explained below, the calibrating filter a (FIR_a) 69 is designed as the coefficient symmetry type FIR filter of seventh order. A transmitting function of the calibrating filter a (FIR_a) 69 is expressed with the Equation (5.6).

$$FIR\_a(z) = h_{a0} + h_{a1}z^{-1} + h_{a2}z^{-2} + h_{a3}z^{-3} + h_{a2}z^{-4} + h_{a1}z^{-5} + h_{a0}z^{-6}$$

Here, $z^{-1} = e^{-j\omega T} = \cos(\omega T) - j\sin(\omega T)$ (5.6)

Therefore, the Equation (5.6) can be expressed as the Equation (5.7).

$$FIR\_a(\omega) = e^{-3j\omega T}(h_{a3} + 2 \cdot h_{a2} \cdot \cos(\omega T) + 2 \cdot h_{a1} \cdot \cos(2\omega T) + 2 \cdot h_{a0} \cdot \cos(3\omega T))$$ (5.7)

From the Equation (5.7), the gain characteristic $G(\omega)$ of the calibrating filter a (FIR_a) 69 is expressed with the Equation (5.8).

$$G(\omega) = |h_{a3} + 2 \cdot h_{a2} \cdot \cos(\omega T) + 2 \cdot h_{a1} \cdot \cos(2\omega T) + 2 \cdot h_{a0} \cdot \cos(3\omega T)|$$ (5.8)

The Equations (5.9) to (5.11) are established because the gains are $a_1$, $a_2$, $a_3$ at the frequencies $f_{IF1}$, $f_{IF2}$, $f_{IF3}$. Moreover, the tap coefficients $h_{a0}$, $h_{a1}$, $h_{a2}$, $h_{a3}$ can be obtained by solving the four simultaneous equations of the Equations (5.9) to (5.12) including the Equation (5.12).

$$G(2\pi f_{IF1}) = a_1$$ (5.9)

$$G(2\pi f_{IF2}) = a_2$$ (5.10)

$$G(2\pi f_{IF3}) = a_3$$ (5.11)

$$\frac{dG(2\pi f_{IF2})}{df} = \frac{a_1 - a_3}{2\pi(f_{IF1} - f_{IF3})}$$ (5.12)

For example, when the simultaneous equations are solved with the sampling frequencies set to 1 MHz, and the frequencies $f_{IF1}$, $f_{IF2}$, and $f_{IF3}$ to 100 kHz, 200 kHz, and 300 kHz, the tap coefficients $h_{a0}$, $h_{a1}$, $h_{a2}$, $h_{a3}$ are expressed with the simplified Equations of only product and sum. Here, only the $h_{a0}$ is indicated.

$$h_{a0} = -2.325015810970534 \times a_1 - \quad (5.13)$$
$$0.26513258266612244 \times a_2 + 2.5901483936366576 \times a_3$$

Therefore, the tap coefficient calculating circuit (T_CALC) 27 can obtain the tap coefficients $h_{a0}$, $h_{a1}$, $h_{a2}$, $h_{a3}$ with the arithmetic operations of the Equation (5.13).

Only the calibrating filter a (FIR_1) 69 is indicated but the calibrating filter b (FIR_b) 70 can also be attained with the similar method.

Moreover, the calculating method is only an example for calculating tap coefficients but the tap coefficients may also be attained with the other method.

Here, the coefficient values of a1, a2, a3 of the Equation (5.13) explained above can be reduced in the number of digits in accordance with the IRR value required. Calculation of tap coefficients may be executed using the logic circuit and baseband circuit or with an exclusive microcomputer.

According to this second embodiment, image rejection can be realized with higher accuracy in the wider frequency band because the IQ mismatch depending on frequency is corrected by conducting the linear transformation to the I and Q components in every frequency $f_{IFi}$ at the setting points of a plurality of frequencies within the frequency band in the manner that the image rejection ratio (IRR) of the image interfering signal to the desired received signal in the predetermined frequency band satisfies the standard required for the receiving using the filter mismatch calibrating unit.

Third Embodiment

Figure 20:
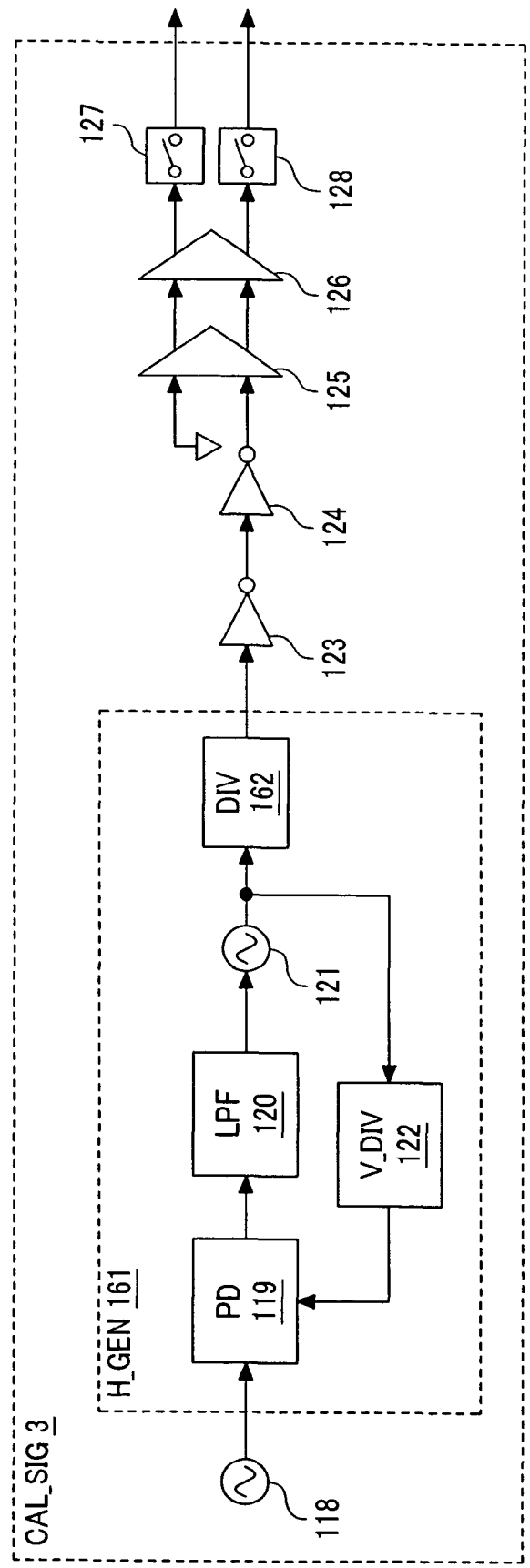
FIG. 20 is a structural diagram a calibration signal source of a third embodiment.

FIG. 20 shows an example of the other structure of the calibration signal source 3 as the third of the present invention. The calibration signal source 3 shown in the figure is constituted with inclusion of a crystal-controlled oscillator 118, a harmonics generating circuit 161, inverters 123, 124, differential amplifiers 125, 126 and switches 127, 128. The reference signal generated with the crystal-controlled oscillator 118 is inputted to the harmonics generating circuit 161. The harmonics generating circuit 161 of the third embodiment is formed of a PLL (Phase Locked Loop) and a fixed frequency divider with inclusion of a phase comparator (PD) 119, a low-pass filter (LPF) 120, a ring oscillator 121, a variable frequency divider (DIV) 122, and a frequency divider 162. The phase comparator (PD) 119, LPF 120, ring oscillator 121, and variable frequency divider (DIV) 122 form a PLL. In the phase comparator (PD) 119, the frequency of reference signal is compared with the frequency of the signal attained by dividing the output frequency of the ring oscillator 121 with the variable frequency divider (DIV) 119. The comparison result is inputted to the LPF 120, On the basis of the comparison result outputted from the ring oscillator 121, the oscillating frequency of the ring oscillator 121 is adjusted. The output signal of the ring oscillator 121 is further divided with the frequency divider 162. A circuit area of the ring oscillator 121 can be reduced by allocating the frequency divider 162 to the output of the PLL.

An output from the harmonics generating circuit 161 is inputted to the inverter 123. The signal is converted to the rectangular wave with the inverters 123, 124 to increase the electrical power of the higher-order harmonics component. Moreover, the rectangular waves outputted from the inverters 123, 124 are amplified with the differential amplifiers 125, 126 and are then outputted via the switches 127, 128. The rectangular wave includes higher-order harmonics and the harmonic of the particular order number among the harmonics is used as the calibration signal.

The calibration signal frequency $f_n$ is expressed with the following Equation, when the frequency of the crystal-controlled oscillator 118 is defined as $f_{CLK}$, dividing ratio of the variable frequency divider (V_DIV) 30 as 1, order number of harmonics as m, and dividing ratio of the frequency divider 162 as n.

$$f_n = f_{CLK} \times 1 \times m \div n$$

The harmonics other than that of the order number m are also inputted to the receiver. However, since the unwanted harmonics components are attenuated with the BPFs 9, 10 in FIG. 1, the digital calibration signal inputted to the correction coefficient calculating circuit (C_CALC) 21 is the signal similar to the tone signal.

Moreover, the amplifier for amplifying the rectangular wave is aimed at amplifying the harmonics and it is not required to be the differential amplifier. It is also possible to use a VCO (Voltage Controlled Oscillator) in place of the ring oscillator 121, but since the calibration signal source is not required to have higher resistance to phase noise, the ring oscillator which may be designed rather easily can be used.

The receiver of this third embodiment has the structure similar to that indicated in the second embodiment in the structure except for the calibration signal source and is capable of conducting the processes similar to that of the second embodiment.

According to this embodiment, image rejection in higher accuracy can be realized in the wider frequency band, because the IQ mismatch depending on frequency can be realized by conducting the linear transformation to the IQ components in every plural frequencies $f_{IFi}$ within the frequency band of the image signal using a plurality of calibration signals $f_i$.

Moreover, since high-speed digital circuits are not required in this embodiment, the calibration signal source explained above can be used as a low power calibration signal source.

Fourth Embodiment

Figure 21:
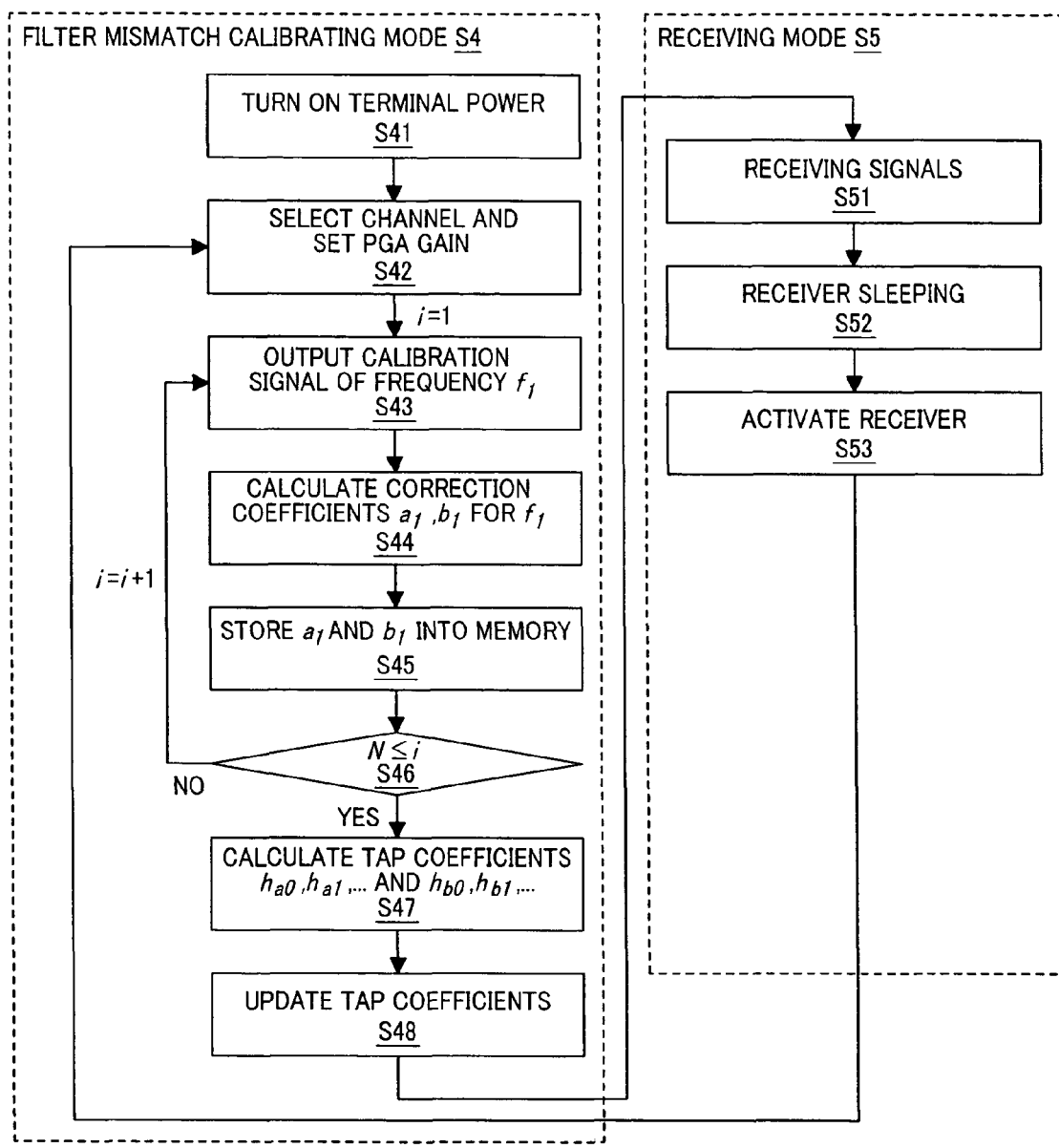
FIG. 21 is a flowchart showing an IQ mismatch calibration sequence of a fourth embodiment of the present invention.

FIG. 21 shows the other example of the sequence for calibrating IQ mismatch of the receiver as the fourth embodiment. The basic apparatus structure of the fourth embodiment is constituted by changing a part of the function corresponding to the amplitude/phase mismatch calibrating circuit (GP_CAL) 25 of the second embodiment and the other portions are identical. Since the filter mismatch calibrating mode is provided to detect the IQ mismatch in a plurality of frequencies, a longer time is sometimes required for calibration. Therefore, in the second embodiment, the filter mismatch calibrating mode has been executed once after the power switch of the receiving terminal is turned ON. Accordingly, before the power switch of the receiving terminal is turned ON, the IQ mismatch changing on time has been calibrated by executing the gain/phase mismatch calibrating mode. However, it is also possible in some cases to execute the filter mismatch calibrating mode before every reception in accordance with the adapted communication standard, system, and hardware.

In the fourth embodiment, every filter mismatch calibrating mode is executed before reception of the signal. This calibrating sequence is shown in FIG. 21.

In this figure, S41 is the filter mismatch calibrating mode. In S41, the power switch of the terminal is turned ON first (S41). Thereafter, the information about frequency $f_{RF}$ and electrical power of the received signal received immediately after the power is turned ON is obtained from the baseband modem. On the basis of this information, setting of the LO frequency and gain of the PGA is conducted (S42). The calibration signal of frequency $f_1$ is inputted to the receiver (S43), the IQ amplitude/phase mismatch of the receiver is detected based on the calibration signal of frequency $f_1$, and the correction coefficients $a_1$, $b_1$ for the mismatch are calculated (S44). The values $a_1$ and $b_1$ are stored in the memory (S45).

The trials up to the S45 from S42 are repeated N times. When the number of trials up to S45 from S42 is less than N times, the process returns to S42. When the number of trials is N or more times, the process goes to the next sequence (S46). With the repetitive trials up to S45 from S42, the correction coefficients $a_1, a_2, \ldots, a_{N-1}, a_N$ and $b_1, b_2, \ldots, b_{N-1}, b_N$ for the frequencies $f_1, f_2, \ldots, f_{N-1}, f_N$ are stored in the memory. Based on these correction coefficients, the tap coefficients $h_{a0}, h_{a1}, \ldots h_{b0}, h_{b1}, \ldots$ of the FIR_a and FIR_b explained later are calculated (S47) for update thereof (S48).

S5 is the receiving mode. After the tap coefficients are updated (S48), the RF receiving signal is received from the antenna (S51). Since the IQ amplitude/phase mismatch in the image signal band in the receiving path is calibrated before reception of the signal, highly accurate image rejection can be realized with the image rejecting circuit (IRC) 26 even when the image signal is received together with the receiving signal. Upon reception of the signal, the receiver is set into the sleeping state until the next reception timing for saving power consumption (S52). When the next reception timing has reached, the receiver is activated again (S53) and the receiver starts again operation in the filter mismatch calibrating mode.

In the case where the IQ mismatch is calibrated in the sequence in this embodiment, the gain/phase mismatch calibrating mode is not required. Therefore, the receiver may be constituted without use of the amplitude/phase mismatch calibrating circuit (GP_CAL) 25 and the switch in relation to the gain/phase mismatch calibrating mode, although such receiver is not shown in the figure.

According to this embodiment, image rejection can be realized with higher accuracy in the wider frequency band, because the IQ mismatch depending on frequency can be corrected through linear transformation of the IQ components in every plural frequencies $f_{IFi}$ within the frequency band of the image signal with a plurality of calibration signals $f_i$, using the filter mismatch calibrating unit.

Moreover, since mismatch depending on frequency is surely calibrated before reception of signal, image rejection can always be realized with higher accuracy in the wider frequency band.

Fifth Embodiment

Figure 22:
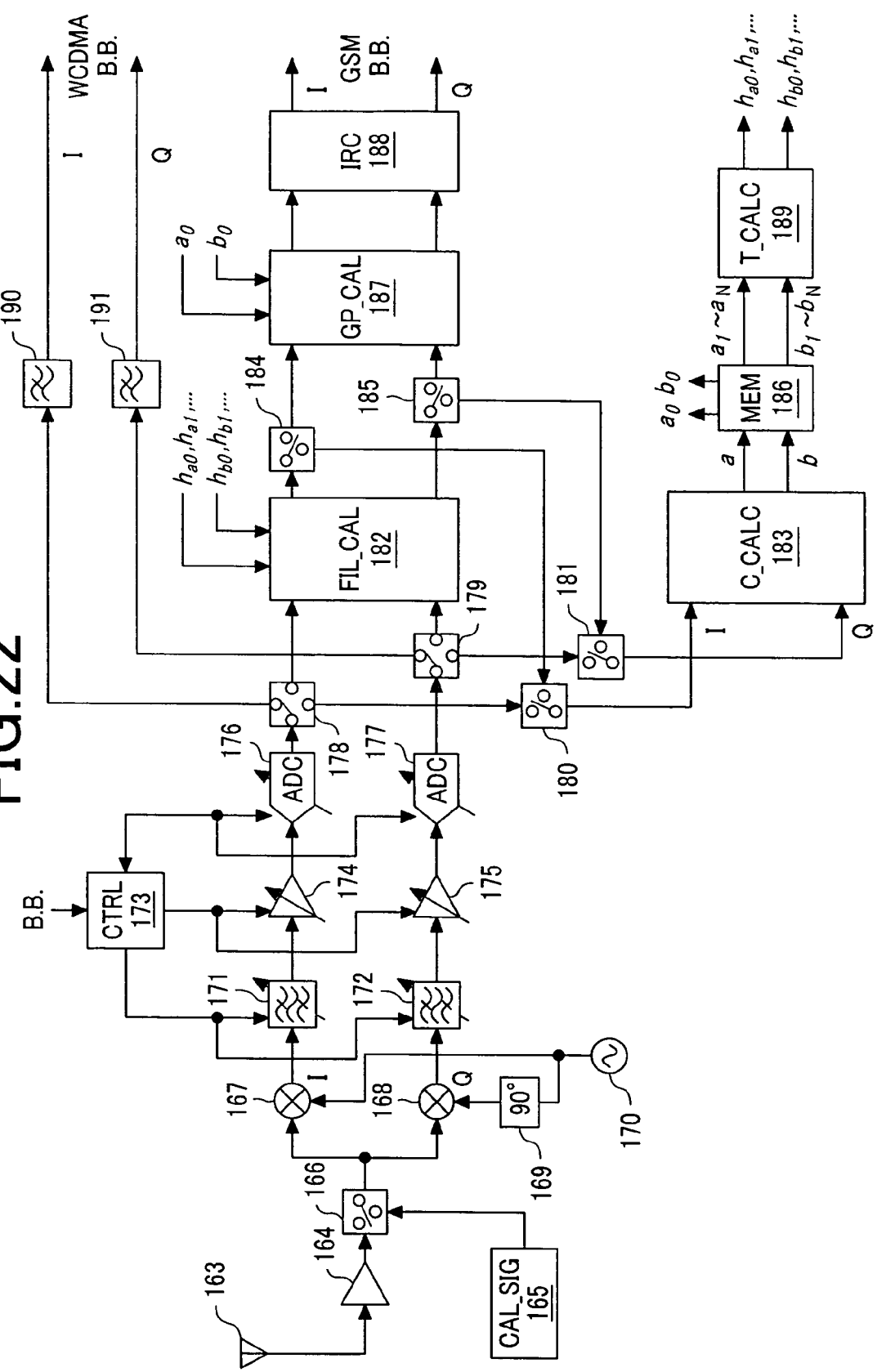
FIG. 22 is a structural diagram of a multi-mode receiver of a fifth embodiment of the present invention.

FIG. 22 shows a fifth embodiment of the present invention. This embodiment is an example of structure of a multimode receiver corresponding to different communication standards. An example of the receiver corresponding to the GSM/EDGE/W-CDMA standard is shown in this figure. The receiver corresponding to the GSM/EDGE/W-CDMA standard is constituted with inclusion of an antenna 163, an LNA 164, a calibration signal source 165, switches 166, 178, 179, 180, 181, 184, 185, mixers 167, 168, an analog 90° phase shifter 169, an RF synthesizer 170, variable BPFs 171, 172, a control circuit 173, PGAs 174, 175, sampling variable ADCs 176, 177, a filter mismatch calibrating circuit (FIL_CAL) 182, a correction coefficient calculating circuit (C_CALC) 183, a memory (MEM) 186, an amplitude/phase mismatch calibrating circuit (GP_CAL) 187, an image rejecting circuit (IRC) 188, and a tap coefficient calculating circuit (T_CALC) 189, and LPFs 190, 191.

This embodiment is characterized in that the filter mismatch calibrating unit is constituted with the calibration signal source 165, switches 166, 178 to 185, filter mismatch calibrating circuit (FIL_CAL) 182, correction coefficient calculating circuit (C_CALC) 183 for detecting filter mismatch and calculating correction coefficients for mismatch, memory (MEM) 186, amplitude/phase mismatch calibrating circuit (GP_CAL) 187, tap coefficient calculating circuit (T_CALC) 189, and calibration control circuit (not illustrated).

In the receiver constituted as explained above, the baseband circuit (B.B.) connected to the receiver selects, when the power switch is turned ON, the optimum communication method from the GSM standard, EDGE standard, and W-CDMA standard in accordance with the radio wave environment and the data to be transmitted and received.

When the communication standard conforming to the GSM/EDGE standards is selected, the receiver of this embodiment receives the signals with the low IF system and executes the processes almost similar to that explained in the first embodiment. In this case, the frequency characteristic and variable sampling ADC of the variable BPFs 174, 175 are controlled with the control circuit (CTRL) 173 for inputting the control signal from the baseband circuit and are then set to the frequency characteristic and sampling frequency suitable for the GSM/EDGE standards.

When the communication method conforming to the W-CDMA standard is selected, the receiver of this embodiment receives the signals with the direct conversion system for converting in direct the frequency of the RF receiving signal to the baseband frequency. When the signals are received with the direct conversion system, image rejection is no longer required. Moreover, the received signal is the QPSK modulation signal and a BER value is never deteriorated to a large extent with the amplitude/phase mismatch in such a degree that the ordinary IC has. Accordingly, it is not required to conduct the calibration of the IQ mismatch explained above.

When the communication method conforming to the W-CDMA standard is selected, the received signal in the RF band received with the antenna 163 is amplified with the LNA 164 and is then inputted to the mixers 167, 168 via the switch 166. Here, in the direct conversion system, the LO signal of the frequency identical to that of the RF frequency of the receiving signal is generated with the RF synthesizer 170. The LO signal generated is then inputted to a couple of mixers 167, 168. One LO signal is inputted in direct to the mixer 167 but the other is inputted to the mixer 168 via the analog 90° phase shifter 169. The received signal and the LO signal are multiplied with the mixers 167, 168 and the received signal is frequency-converted to the baseband frequency. Thereafter, noise near DC such as DC offset and flicker noise and out-of-band noise such as interfering signal are rejected with the variable BPFs 171, 172.

Thereafter, the received signal is subjected to gain adjustment with the PGAs 174, 175 and is then converted to the digital signal with the variable sampling ADCs 176, 177. In addition, the received signal is inputted, after channel selection with the LPFs 190, 191, to the baseband circuit for WCDMA for digital demodulation process. The frequency characteristic and variable sampling ACD of the variable BPFs 174, 175 are controlled with the control circuit (CTRL) 173 for inputting the control signal from the baseband circuit and are then set to the frequency characteristic and sampling frequency suitable for the WCDMA standard.

According to this embodiment, image rejection with higher accuracy in wider frequency band can be realized because the IQ mismatch depending on frequency is corrected through linear transformation of the IQ components in every one of plural frequencies $f_{IFi}$ within the frequency band of the image signal with a plurality of calibration signals $f_i$, using the filter mismatch calibrating unit.

Moreover, this embodiment can realize the receiver corresponding to the GSM/EDGE/W-CDMA standards of different receiving systems as the single receiver without increase in the circuit scale through common use of the analog circuits. Namely, reduction in chip area can be expected through common use of the analog circuits, although the receiver is capable of covering a plurality of different receiving systems.

Sixth Embodiment

Figure 23:
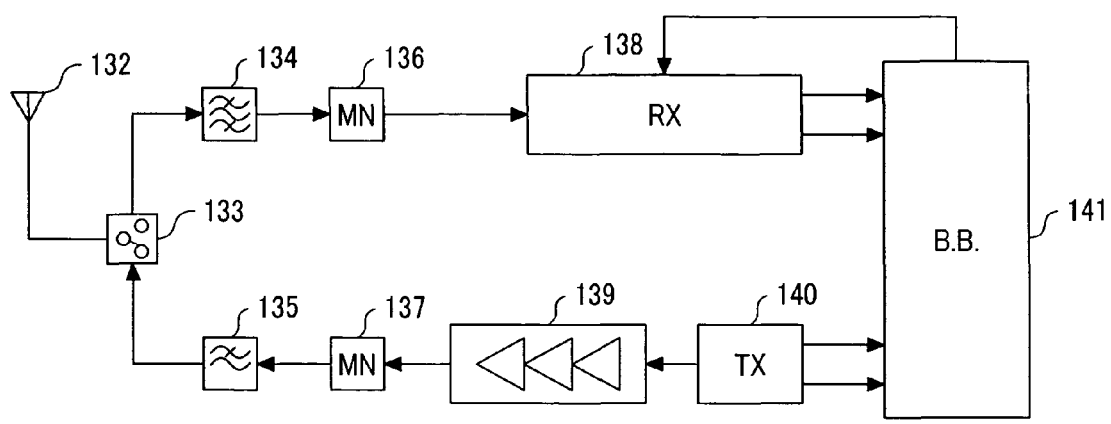
FIG. 23 is a diagram for explaining a sixth embodiment of the present invention.

FIG. 23 shows a sixth embodiment of the present invention. This embodiment is a mobile radio terminal such as a mobile phone using the receiver described in any of the first, second, third, fourth and fifth embodiments. The mobile radio terminal shown in FIG. 23 is constituted with inclusion of an antenna 132, a switch 133, a BPF 134, a reception matching circuit (MN) 136, a receiver (Rx) shown in FIG. 1, FIG. 9, and FIG. 22, a baseband circuit (B.B.) 141, a transmitting circuit (Tx) 140, a power amplifier 139, a transmission matching circuit (MN) 137, and an LPF 135.

Namely, the mobile radio terminal of this embodiment comprises at least the antenna 132, switch 133 connected to the antenna to switch the connections for transmission and reception, receiver (Rx) 138 coupled in the receiving side of this switch, baseband circuit (B.B.) 141 for inputting the baseband received signal including the in-phase component and quadrature component outputted from the receiver and generating and outputting the baseband transmitting signal including the in-phase component and quadrature component, transmitting circuit (Tx) 140 for outputting the quadrature modulation signal of a first frequency by executing the quadrature modulation to the baseband transmitting signal, and power amplifier 139 coupled to the transmitting side of the antenna 132 to amplify the quadrature modulation signal of the first frequency.

Moreover, this receiver comprises, as is already described above, a multiplier for converting the received signal of the first frequency including the in-phase and quadrature components to the quadrature modulation signal of a second frequency, a signal path for outputting unwanted frequency signals other than the quadrature modulation signal outputted from the multiplier by at least attenuating such unwanted signals, an image rejecting circuit for rejecting the image signal of the frequency symmetrical to the received signal of the first frequency for the local signal of the second frequency, a correction coefficient calculating circuit for outputting correction values to the mismatches by detecting amplitude mismatch and phase mismatch between the in-phase component and quadrature component of the quadrature demodulation signal outputted from the signal path, a first correcting circuit for correcting the amplitude mismatch and phase mismatch between the in-phase component and quadrature component of the quadrature modulation signal outputted from the signal path, and a calibration signal source for varying the frequency.

The first correcting circuit executes a first correction of the amplitude mismatch and phase mismatch depending on frequency using a first correction value for a plurality of frequencies outputted from a correction value calculating circuit.

This radio mobile terminal executes, as a receiving method, the steps of:

converting the real signal or the quadrature-modulated received signal of the first frequency to the quadrature modulation signal of a third frequency with the local signal expressed by a complex signal of the second frequency;

outputting unwanted frequency signals other than the quadrature demodulation signal outputted from the multiplier at least after attenuation of unwanted signals;

rejecting the image signal of the frequency symmetrical to the received signal of the first frequency for the local signal of the second frequency;

outputting correction values for mismatches by detecting amplitude mismatch and phase mismatch between the in-phase component and quadrature component of the quadrature demodulation signal outputted from the signal path, and correcting the amplitude mismatch and phase mismatch between the in-phase component and quadrature component of the quadrature demodulation signal outputted from the signal path, wherein, the first correcting circuit executes a first correction to the amplitude mismatch and phase depending on frequency using a first correction value for a plurality of frequencies outputted from the correction value calculating circuit.

In more concrete, the receiving signal received through the antenna 132 of this radio mobile terminal is inputted to the receiver 138 through the switch 133 for switching transmission and reception and moreover the BPF 134 for rejecting unwanted signals and the reception matching circuit 136. The I component and Q component of the baseband signal obtained by the receiver 138 are supplied to the baseband circuit 141.

The baseband circuit 141 conducts baseband signal processes for input and output of the I component and Q component of the baseband signal and also conducts exchange of signals among microphone, speaker, keyboard, and display unit, although these elements are not illustrated in the figure. Moreover, the baseband circuit 141 generates the control signal for controlling respective sections in the terminal.

The I and Q components of the baseband signal generated in the baseband circuit 141 are then inputted to the transmitting circuit 140. This transmitting circuit 140 outputs the transmitting signal as the quadrature modulation signal through quadrature modulation to the input I and Q components. The transmitting signal is guided to the antenna 132 via the power amplifier 139, transmission matching circuit 137 and LPF 135 for rejecting unwanted signals.

The mobile radio terminal of this embodiment is capable of reducing, with employment of the receiver of the present invention, mismatches of I and Q components in the quadrature demodulation signal generated by fluctuation in elements in a plurality of frequencies and thereby realizing image rejection with higher accuracy in wider frequency band in the digital region when the receiver employs the low IF system.

What is claimed is:

1. A receiver comprising:
a quadrature mixer for providing a pair of demodulation outputs of I component and Q component substantially quadrature from a received RF signal and
a local signal for receiving; and
a phase/amplitude calibrating unit for calibrating amplitude mismatch and phase mismatch between the pair of demodulation outputs, the phase/amplitude calibrating unit including a calibrating filter, wherein
the phase/amplitude calibrating unit has a function to set image rejection ratios at the setting points of a plurality of frequencies in multiple channels of the received signal using the calibrating filter so that an image rejection ratio (IRR) of the image interfering signal for the plurality of frequencies in the multiple channels of the received signal within a frequency band of the quadrature mixer output satisfies the standards required for the receiver.

2. The receiver according to claim 1, wherein the calibrating filter has a frequency response to conduct linear transformation to the signals of I and Q components as the pair of demodulation outputs for setting the image rejection ratio.

3. The receiver according to claim 2, wherein the filter is an FIR filter.

4. The receiver according to claim 1, wherein the phase/amplitude calibrating unit comprise:
  a correction coefficient calculating circuit for calculating correction coefficients for amplitude mismatch and phase mismatch between the I and Q components at a single frequency;
  a memory for storing the correction coefficients for a plurality of frequencies outputted from the correction coefficient calculating circuit corresponding to a plurality of calibration signals;
  a tap coefficient calculating circuit for calculating frequency response of the filter using the correction coefficients read from the memory; and
  a filter mismatch calibrating circuit constituted with inclusion of a plurality of calibrating filters and digital adders for correcting IQ mismatches depending on frequencies.

5. The receivers according to claim 4, wherein the phase/amplitude calibrating unit comprises, as the calibration signal source, an oscillator, and a harmonics generating circuit for generating harmonics of the oscillator in order to set the image rejection ratio using the harmonics.

6. The receiver according to claim 1, wherein the phase/amplitude calibrating unit comprises a gain/phase mismatch calibrating circuit having a function that an image rejection ratio (IRR) of the image interfering signal for the plurality of frequencies in the multiple channels of the received signal in the predetermined frequency band of the output from the quadrature mixer satisfies the standards by setting a single image rejection ratio at the setting of a single frequency.

7. The receiver according to claim 1, wherein the phase/amplitude calibrating unit sets, when the received signal is divided in time by a plurality of burst signals, a plurality of image rejection ratios for every burst signal before reception of the burst signals.

8. The receiver according to claim 7,
  wherein a plurality of image rejection ratios at the setting points of a plurality of frequencies are set when the power switch of the receiver is turned ON in the case where the received signal is divided in time by a plurality of burst signals, and
  wherein a single image rejection ratio at the setting point of single frequency is set for every the burst signal before the burst signal is received.

9. The receiver according to claim 1,
  wherein the receiver corresponds to different communication standards and receives the signals with different receiving systems, and
  wherein the phase/amplitude calibrating unit has a function to set the image rejection ratios at the setting points of a plurality of frequencies within the frequency band for the respective receiving systems.

10. A receiver comprising:
  a quadrature mixer for generating a couple of demodulation outputs of I component and Q component substantially quadrature from a received RF signal and a local signal for receiving; an I component signal path;
  a Q component signal path; and
  a phase/amplitude calibrating unit for calibrating amplitude mismatch and phase mismatch of the I component and Q component, wherein
  the phase/amplitude calibrating unit includes a calibrating filter having a frequency response $f_i,(z)$, and has a function to determine the frequency response of the calibrating filter using calibration signals of a plurality of frequencies $f_i$, in order to make zero, amplitude and phase mismatches of the I and Q components in the I component signal path and Q component signal path at a plurality of frequencies $f_{IFi}$, within a desired frequency band satisfying a relevant standard of the receiver.

11. The receiver according to claim 10,
  wherein the phase/amplitude calibrating unit comprises the calibrating filter and a filter mismatch calibrating circuit coupled to the I component signal path and the Q component signal path, and has a function to calibrate the frequency response of the calibrating filter so that an image rejection ratio (IRR) of the image interfering signal for the desired received signal in the frequency band satisfies the standard required for the receiver based on the detection result of amplitude and phase mismatches of the I component and the Q component in the I component signal path and the Q component signal path.

12. The receiver according to claim 11, comprising:
  an image rejecting circuit coupled to the I component signal path and the Q component signal path for frequency-converting a received signal to the baseband from the IF band;
  a filter mismatch detecting circuit for detecting, at the setting points of a plurality of frequencies, amplitude mismatches of the I component and the Q component in the I component signal path and the Q component signal path;
  a correction coefficient calculating circuit for calculating correction coefficients for amplitude mismatch and phase mismatch between the I component and the Q component of each of the frequencies based on the detection result; and
  a tap coefficient calculating circuit for calculating the frequency response of the filter using the correction coefficient.

13. A receiver comprising:
  a quadrature mixer for generating a pair of demodulation outputs of I component and Q component substantially quadrature from a received RF signal and
  a local signal for receiving;
  a phase/amplitude calibrating unit for calibrating amplitude mismatch and phase mismatch of the I component and Q component, the phase/amplitude calibrating unit including a calibrating filter; and
  an image rejecting circuit for frequency-converting the received signal to the baseband from the IF band,
  wherein the phase/amplitude calibrating unit has a function to set image rejection ratios at the setting points of a plurality of frequencies in multiple channels of the received signal using the calibrating filter so that an image rejection ratio (IRR) of the image interfering signal for the plurality of frequencies in the multiple channels of the received signal in the frequency band in the input side of the image rejecting circuit satisfies the standards required for the receiver.

14. The receiver according to claim 13, comprising:
  a multiplier for converting a real signal or a quadrature-modulated received signal of a first frequency to the quadrature demodulation signal of a third frequency by a local signal expressed with a complex signal of a second frequency;

a signal path for outputting unwanted signals other than the quadrature demodulation signal output from the multiplier at least after the unwanted signals are attenuated;

the image rejecting circuit for rejecting the image signal of the frequency symmetrical to the received signal of the first frequency for the local signal of the second frequency; and a phase/amplitude calibrating unit, including:
- a correction value calculating circuit for outputting a correction value for a mismatch by detecting amplitude mismatch and phase mismatch between the in-phase component and quadrature component of the quadrature demodulation signal outputted from the signal path;
- a first correcting circuit for correcting amplitude mismatch and phase mismatch between the in-phase component and the quadrature component of the quadrature demodulation signal outputted from the signal path; and a calibration signal source for varying the frequencies, wherein the phase/amplitude calibrating unit has a function to conduct a first correction of the amplitude mismatch and phase mismatch depending on frequency using a first correction value for a plurality of frequencies outputted from the correction value calculating circuit corresponding to a plurality of frequencies.

15. The receiver according to claim 13,
wherein the signal path outputs the digital quadrature modulation signal by providing an analog/digital converter in the output side thereof, and
wherein the phase/amplitude calibrating unit inputs the digital quadrature modulation signal and conducts the first correction with the digital signal process.

16. The receiver according to claim 14,
wherein the first correcting circuit is formed of an FIR filter and further comprises a tap coefficient calculating circuit; and
wherein the tap coefficient calculating circuit calculates tap coefficients of the FIR filter from the first correction value for a plurality of frequencies outputted from the correction value calculating circuit.

17. The receiver according to claim 13, comprising:
a second correcting circuit for correcting amplitude mismatch and phase mismatch between the in-phase component and the quadrature component of the quadrature demodulation signal,
wherein the second correcting circuit conducts a second correction of amplitude mismatch and phase mismatch not depending on frequency using a second correction value for signal frequency outputted from the correction value calculating circuit.

18. The receiver according to claim 17, comprising a memory for storing the second correction value for single frequency outputted from the correction value calculating circuit,
wherein the second correcting circuit conducts the second correction of amplitude mismatch and phase mismatch not depending on frequency using the second correction value read out from the memory.

19. The receiver according to claim 18,
wherein the calibration signal source comprises an oscillator and a harmonics generating circuit to generate harmonics,
wherein the harmonics generating circuit includes a frequency multiplier, and wherein the first correction and the second correction are conducted using, as the calibration signal, a harmonic of the signal obtained by multiplying frequency of the clock signal of the receiver.

20. The receiver according to claim 17,
wherein the calibration signal source comprises an oscillator and a harmonics generating circuit to generate harmonics,
wherein the harmonics generating circuit comprises a fractional frequency divider, and
wherein the first correction and the second correction are conducted using, as the calibration signal, the harmonic of the signal obtained through fractional frequency-division of the local signal of the receiver.

* * * * *